United States Patent
Zidan et al.

(10) Patent No.: US 10,998,037 B2
(45) Date of Patent: May 4, 2021

(54) MEMORY PROCESSING UNITS AND METHODS OF COMPUTING DOT PRODUCTS

(71) Applicant: MemryX Inc., Ann Arbor, MI (US)

(72) Inventors: Mohammed Zidan, Ann Arbor, MI (US); Chester Liu, Ann Arbor, MI (US); Zhengya Zhang, Ann Arbor, MI (US); Wei Lu, Ann Arbor, MI (US)

(73) Assignee: MemryX Incorporated, Ann Arbor, MI (US)

( * ) Notice: Subject to any disclaimer, the term of this patent is extended or adjusted under 35 U.S.C. 154(b) by 0 days.

(21) Appl. No.: 16/726,603

(22) Filed: Dec. 24, 2019

(65) Prior Publication Data
US 2020/0357459 A1  Nov. 12, 2020

Related U.S. Application Data

(60) Provisional application No. 62/844,644, filed on May 7, 2019.

(51) Int. Cl.

| | |
|---|---|
| *G11C 11/408* | (2006.01) |
| *G11C 11/4094* | (2006.01) |
| *G06F 7/487* | (2006.01) |
| *G11C 7/10* | (2006.01) |
| *G06F 9/30* | (2018.01) |
| *G11C 11/4074* | (2006.01) |

(52) U.S. Cl.
CPC ........ *G11C 11/4085* (2013.01); *G06F 7/4876* (2013.01); *G06F 9/30134* (2013.01); *G11C 7/1036* (2013.01); *G11C 11/4074* (2013.01); *G11C 11/4094* (2013.01)

(58) Field of Classification Search
CPC .............. G11C 11/4085; G11C 7/1036; G11C 11/4094; G11C 11/4074; G06F 7/4876; G06F 9/30134
USPC ...................................................... 365/230.06
See application file for complete search history.

(56) References Cited

U.S. PATENT DOCUMENTS

| | | | |
|---|---|---|---|
| 6,266,746 B1 * | 7/2001 | Ando | ........................ G06F 5/10 |
| | | | 326/40 |
| 2003/0041082 A1 | 2/2003 | Dibrino | |
| 2004/0076044 A1 | 4/2004 | Nowshadi | |
| 2004/0213036 A1 | 10/2004 | Farrell et al. | |
| 2004/0230633 A1 | 11/2004 | Busada et al. | |

(Continued)

FOREIGN PATENT DOCUMENTS

| | | |
|---|---|---|
| KR | 1020120028229 | 3/2012 |
| KR | 1020130128695 | 11/2013 |
| KR | 1020160140394 | 12/2016 |

*Primary Examiner* — Xiaochun L Chen

(57) ABSTRACT

A memory processing unit can be configured to compute partial products between one or more elements of a first matrix stored in a given row of a memory cell array and sequential bits of one or more elements of a second matrix. The partial products can be calculated first sequentially across the set of rows and second sequentially across the bit positions of the elements of the second matrix. Alternatively, the partial products can be calculated first sequentially across the bit positions of the elements of the second matrix first and second sequentially across the set of rows. The partial products for each column of elements can be accumulated and bit shifted to compute the dot product of the first and second matrix.

23 Claims, 21 Drawing Sheets

(56) References Cited

U.S. PATENT DOCUMENTS

| | | | |
|---|---|---|---|
| 2005/0146911 A1* | 7/2005 | Kuenemund | G11C 5/063 |
| | | | 365/63 |
| 2006/0212505 A1 | 9/2006 | Islam | |
| 2010/0228923 A1 | 9/2010 | Lim | |
| 2010/0308858 A1 | 12/2010 | Noda et al. | |
| 2010/0332775 A1 | 12/2010 | Kapil et al. | |
| 2013/0090907 A1 | 4/2013 | Maliassov | |
| 2013/0223140 A1* | 8/2013 | Sohn | G11C 7/1006 |
| | | | 365/158 |
| 2015/0085575 A1 | 3/2015 | Tam | |
| 2017/0357891 A1 | 12/2017 | Judd et al. | |
| 2018/0234653 A1 | 8/2018 | Meixner et al. | |
| 2019/0080231 A1* | 3/2019 | Nestler | G06N 3/0481 |
| 2019/0102358 A1* | 4/2019 | Asnaashari | G11C 7/18 |

\* cited by examiner

MEMORY PROCESSING UNITS AND METHODS OF COMPUTING DOT PRODUCTS

CROSS-REFERENCE TO RELATED APPLICATIONS

This application claims the benefit of U.S. Provisional Patent Application No. 62/844,644 filed May 7, 2019, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. In conventional computing systems, data is transferred from memory to one or more processing units, the processing units can perform calculations on the data, and the results are then transferred back to memory. The transfer of large amounts of data from memory to the processing unit and back to memory takes time and consumes power. Accordingly, there is a continuing need for improved computing systems that reduce processing latency, data transfer latency and or power consumption.

SUMMARY OF THE INVENTION

The present technology may best be understood by referring to the following description and accompanying drawings that are used to illustrate embodiments of the present technology directed toward memory processing units and methods of computing dot products.

In one embodiment, a memory device can include an array of memory cells arranged in a plurality of rows of memory cells coupled to respective word lines and a plurality of columns of the memory cells coupled to respective bit lines. The memory cells can be configured to store a first matrix of r rows and c columns of values. Each of a set of r rows of the memory cell array can store c values, wherein each value comprises n bits. The memory device can also include one or more sets of input registers, word line drivers, readout circuitry, one or more accumulators and one or more shift register. Each set of input register can be associated with a respective set of word lines. Each input register in a set can be configured to store a respective element of a second matrix. The word line drivers can be coupled to the input registers and to a corresponding set of word lines. The word line drivers can be configured to sequentially bias the respective set of word lines based on bit values of sequential bit positions in the corresponding input registers. The readout circuitry can be coupled to one or more sets of respective bit lines. The readout circuitry can be configured to sense the one or more sets of respective bit lines to determine partial products for each set of respective bit lines in response to the word line driver biasing each word line for each bit position in the corresponding input register. The one or more accumulators can be coupled to the readout circuitry. Each accumulator can be associated with a respective set of bit lines. Each accumulator can be configured to sum each partial product determined by the corresponding readout circuitry to a content of a corresponding shift register and load the sum into the corresponding shift register. Each shift register can be coupled to a respective accumulator. Each shift register can be configured to shift the sum in a given direction after each sum is loaded into the shift register and to output a resulting dot product of the first and second matrix.

In another embodiment, a method of calculating a dot product in a memory device can include loading a first matrix into a memory cell array at a set of word lines and bit lines. In addition, a second matrix can be loaded into a plurality of input registers associated with respective ones of the set of word lines. Sense voltage levels based on a given sequence of bit positions in the input registers can be sequentially applied to respective ones of the set of word lines. One or more sets of bit lines can be sensed in response to each sequence of applied sense voltage levels to determine partial products from each set of bit lines for each sequence of applied sense voltage levels. Each determined partial product can be accumulated for each of the one or more sets of bit lines. The accumulated partial product can be bit shifted after accumulating each partial product to determine the dot product of the first matrix and the second matrix.

In another embodiment, a memory device can include an array of memory cells arranged in a plurality of rows of memory cells coupled to respective word lines and a plurality of columns of the memory cells coupled to respective bit lines. The memory cells can be configured to store a first matrix of r rows and c columns of values. Each of a set of r rows of the memory cell array can store c values, wherein each value comprises n bits. The memory device can also include address inputs, an input register, word line drivers, readout circuitry, one or more accumulators and one or more shift registers. The address inputs can be configured to sequentially select a respective word line in the set of word lines. The input registers can be coupled to a read enable, wherein the input register is configured to store one or more bits of one or more elements of a second matrix. The word line drivers can be coupled to the address inputs, the read enable and to corresponding word lines. The word line drivers can be configured to sequentially bias a respective set of word lines based on a current bit value in the input register and the current address inputs. The readout circuitry can be coupled to one or more sets of respective bit lines. The readout circuitry can be configured to sense the one or more sets of respective bit lines to determine partial products for each set of respective bit lines in response to the word line drivers biasing each word line based on each bit position in the corresponding input register. The one or more accumulators can be coupled to the readout circuitry. Each accumulator can be associated with a respective set of bit lines. Each accumulator can be configured to sum each partial product determined by the corresponding readout circuitry to a content of a corresponding shift register and load the sum into the corresponding shift register. Each shift register can be coupled to a respective accumulator and can be configured to shift the sum in a given direction after a predetermined number of sums are loaded into the shift register and to output a resulting dot product of the first and second matrix.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
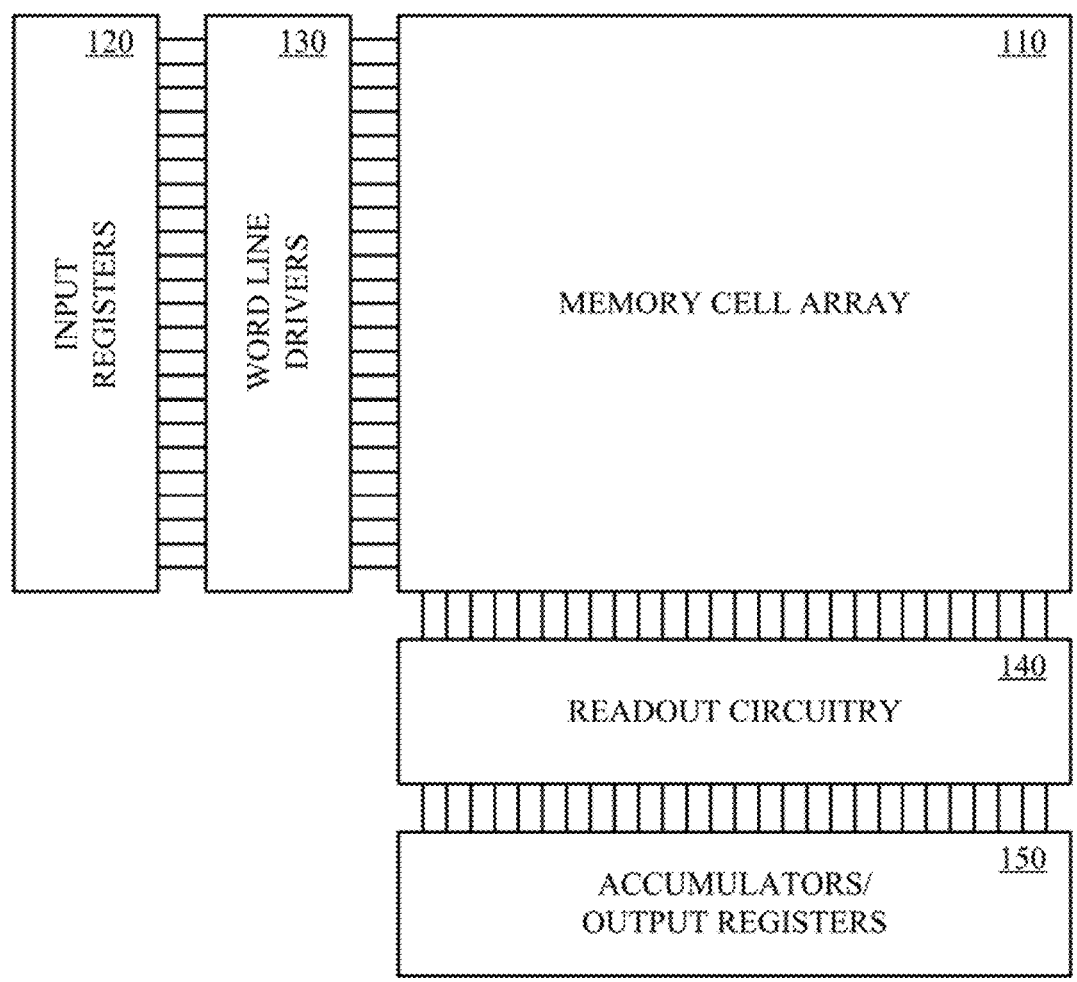
FIG. 1 shows a memory device configured to compute a matrix dot product, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc, may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 1, a memory device, in accordance with aspects of the present technology, is shown. The memory device 100 can include a memory cell array 110, input registers 120, word line drivers 130, readout circuitry 140, and accumulator/output registers 150. The memory device can include other well-known circuits that are not necessary for an understanding of the present technology and therefore are not discussed herein.

Figure 2:
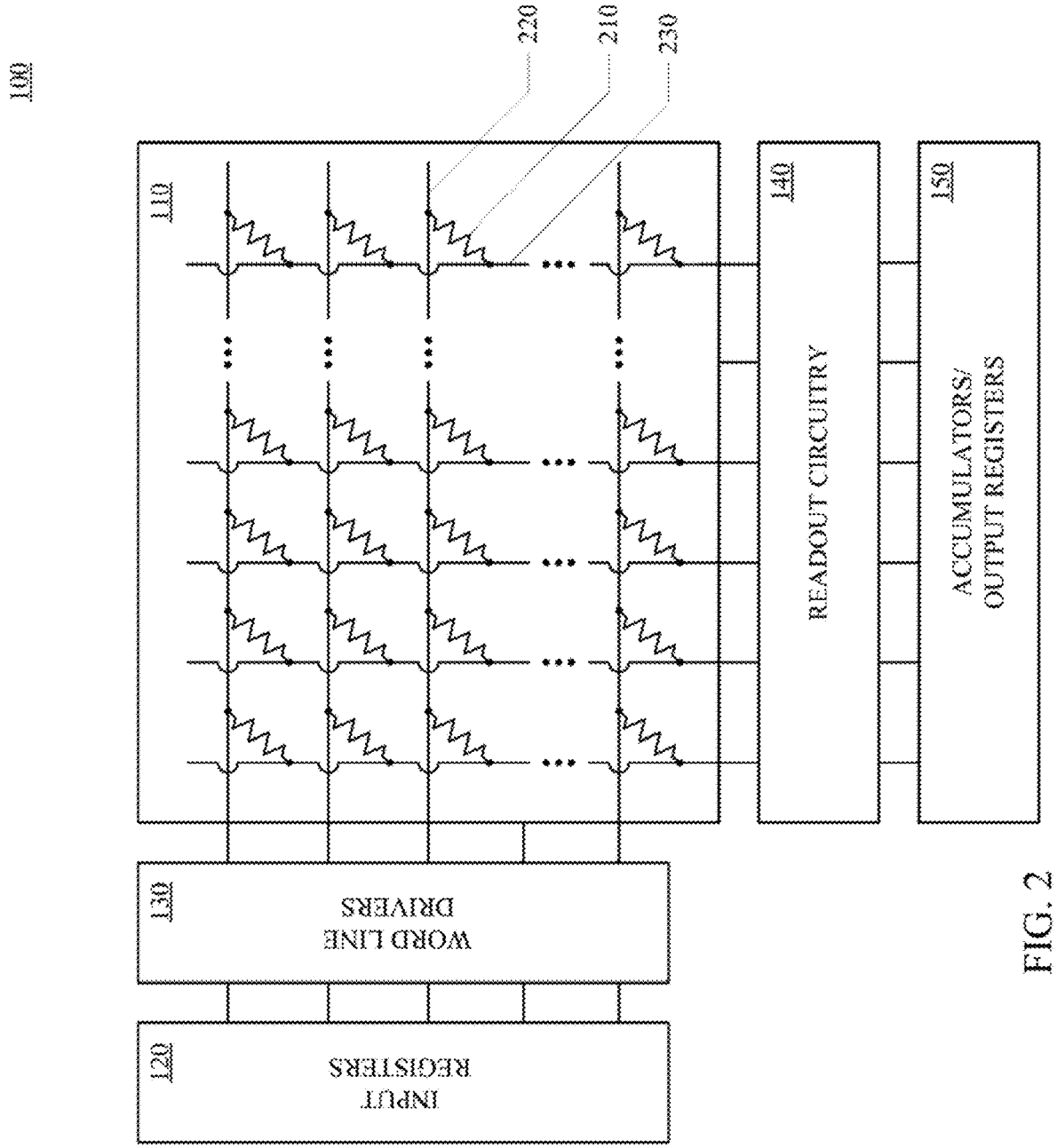
FIG. 2 shows a gateless cell architecture memory device, in accordance with aspects of the present technology.
Figure 3:
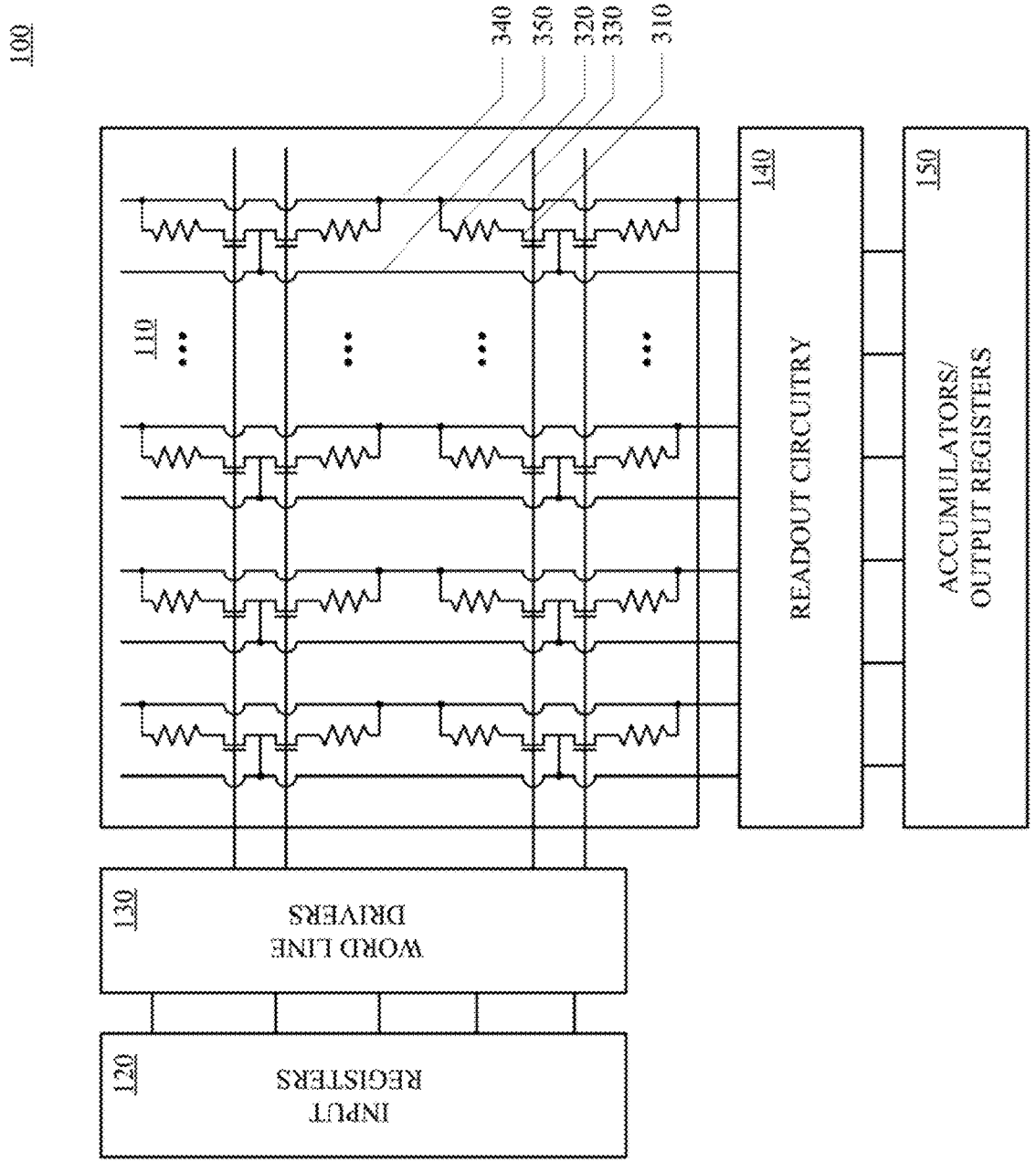
FIG. 3 shows a gated cell architecture memory device, in accordance with aspects of the present technology.

The memory cell array 110 can be arranged in a plurality of rows of memory cells coupled to respective word lines and a plurality of columns of memory cells coupled to respective bit lines. The memory cells can be programmed to one of two states representing corresponding binary values of '0' and '1'. The memory cell array 110 can be of any number of different architectures. In one exemplary implementation, the memory cell array 110 can be comprised of single resistive memory cells, as illustrated in FIG. 2. Each resistive memory cell 210 can be coupled across a respective word line 220 and a respective bit line 230. In another exemplary implementation, each memory cell can be comprised of a transistor 310 and a resistive element 320, as illustrated in FIG. 3. The gate of the transistor 310 can be coupled to a respective word line 330. The resistive element 320 can be coupled between a respective bit line 340 and the source of the transistor 310. The drain of the transistor 310 can be coupled to a respective source line 350. In a resistive random-access memory architecture, a '0' bit can be represented by a high-resistance state of the memory cell, and a '1' can be represented by a low-resistance state of the memory cell.

Referring again to FIG. 1, the memory device 100 can be configured to store data in accordance with conventional aspects of memory devices. For instance, the word line drivers 130 can drive a select word line of the array in accordance with a decoded memory address. The readout circuitry 140 can utilize the bit lines, or a combination of the bit lines and the source lines, to read from and write to memory cells of a selected word line of the array.

Figure 4:
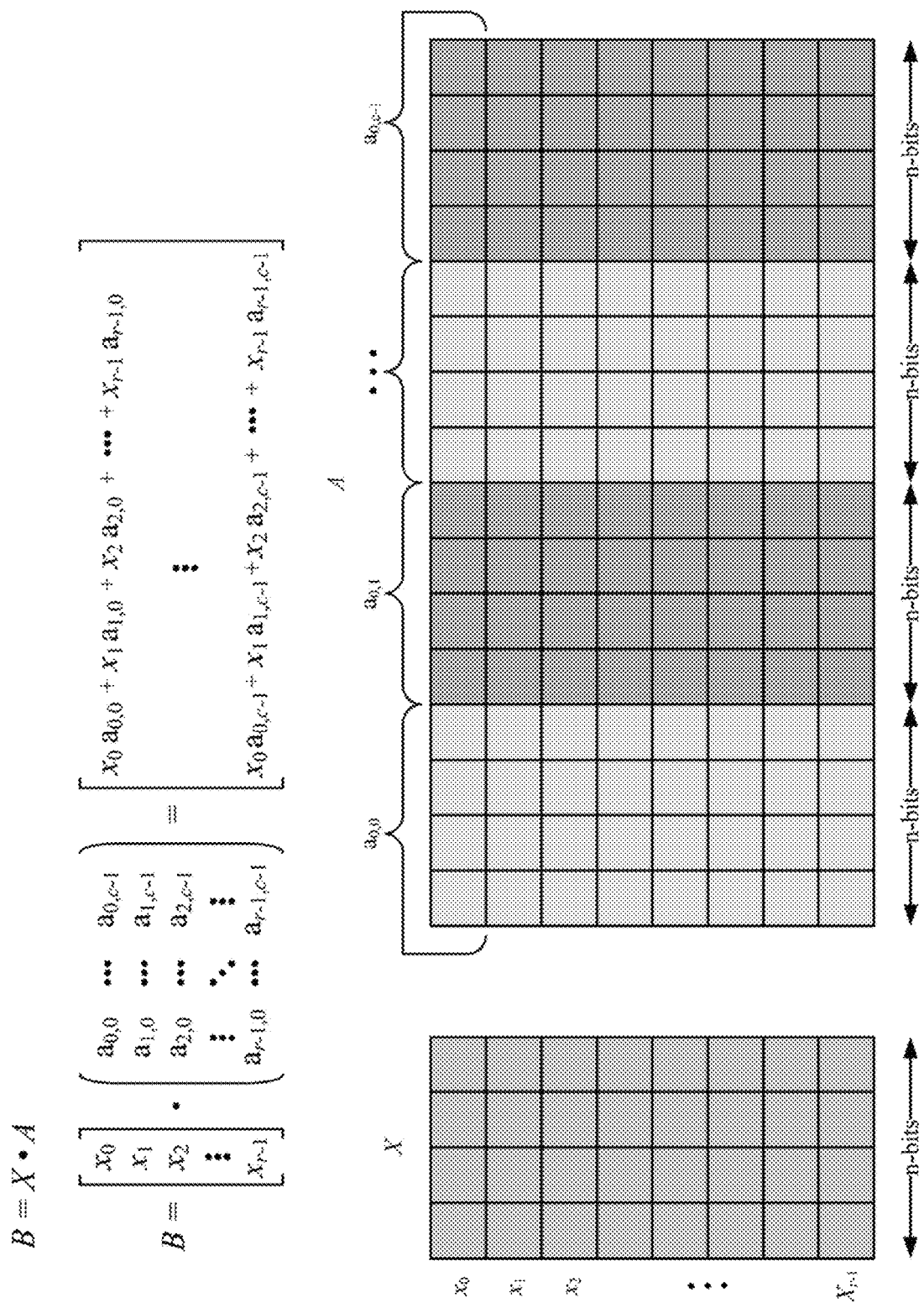
FIG. 4 illustrates an exemplary dot product, in accordance with aspects of the present technology.

The memory device 100 can also be configured to compute matrix dot products. Matrix dot products are used in artificial intelligence, big-data analysis, edge computing and the like. For use in computing matrix dot products, the accumulators and output registers 150 can be coupled to the readout circuitry 140. A first matrix A can be stored in the array of memory cells 110, and a second matrix X can be loaded into the input registers 120. Referring now to FIG. 4, an example of the first matrix A loaded in a portion of the array of memory cells 110, and the second matrix X loaded in the input registers is illustrated. In the example, the first matrix can include r rows and c columns of elements, the second matrix can include r rows and one column of elements. The elements can comprise values represented by n bits. In the example, as illustrated in FIG. 4, the element values can be 4-bit values. However, it is appreciated that the matrix elements can be of any predetermined number of bits. For example, in neural network applications, the matrix elements are commonly 8-bit values. Each row of the input registers can be associated with a corresponding word line. As illustrated in FIG. 4, the four bit value of the first element $x_0$ of the second matrix can be loaded into a first four bit register, the second element $x_1$ of the second matrix can be loaded into a second four bit register, and so on, with the last element $x_{n-1}$ of the second matrix loaded into a last four bit register. Similarly, a first element $a_{0,0}$ in a first row of the first matrix can be loaded into a first four bits of a first row of a group of memory cells, a second element $a_{0,1}$ in the first row of the matrix can be loaded into the next four bits of the first row of the group of memory cells, and so on, with the last element $a_{r-1,c-1}$ in a last row of the first matrix loaded into the last four bits in the last row of the group of memory cells. The matrix dot product can be computed by multiplying each element in the second matrix X with the corresponding element in the first column of the first matrix A and summing the partial products thereof, and repeating the process for each column of the first matrix A such that the elements in the second matrix X multiplied with the corresponding element in the last column of the first matrix A, and summing the partial products thereof.

Figure 5:
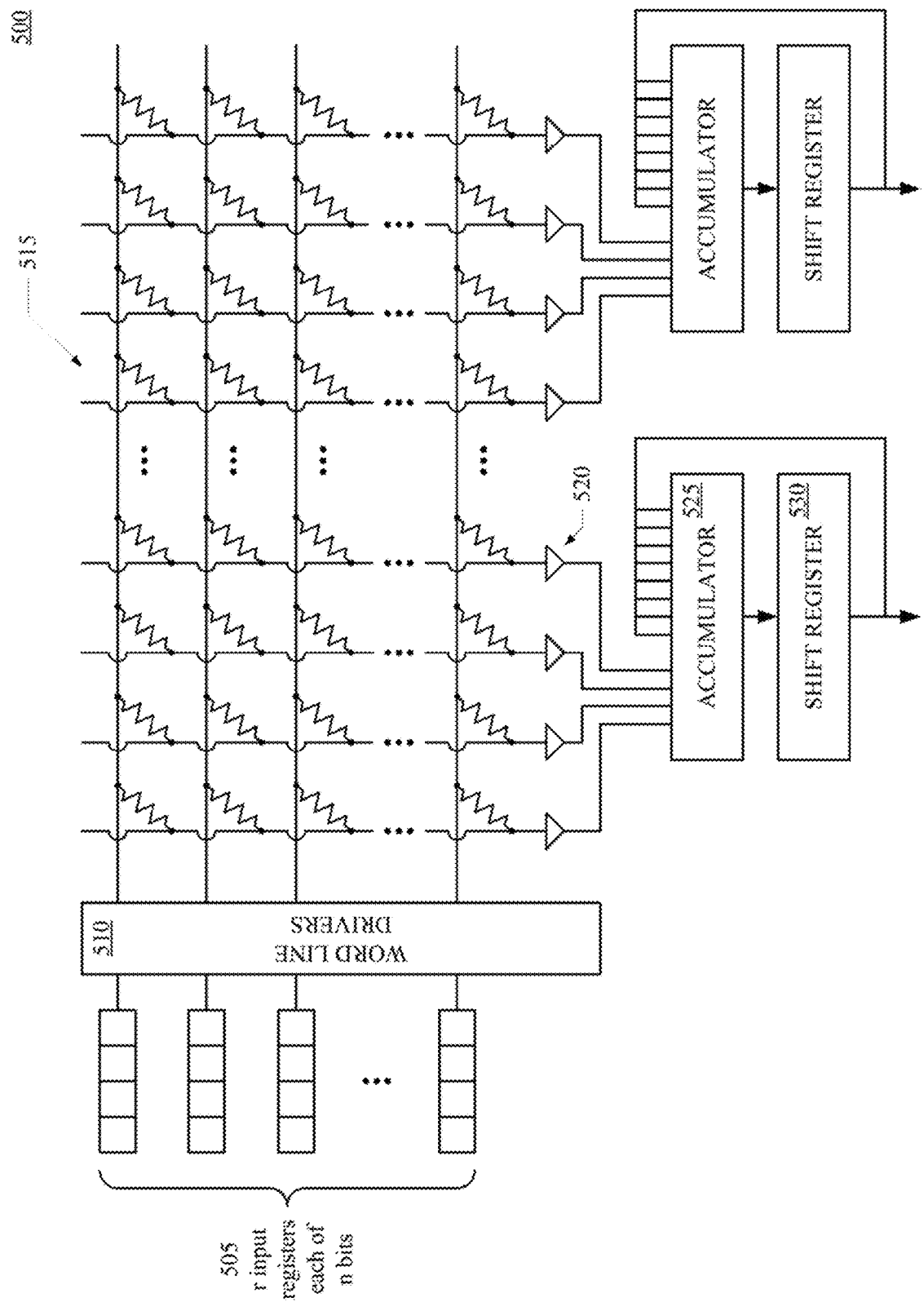
FIG. 5 shows a memory device configured to compute a matrix dot product, in accordance with aspects of the present technology.

Referring now to FIG. 5, a memory device configured to compute matrix dot products, in accordance with aspects of the present technology is shown. The memory device 500 can include one or more sets of input registers 505, word line drivers 510, an array of memory cells 515, readout circuitry 520, one or more accumulators 525, and one or more shift registers 530. The memory cells can be configured to store a first matrix A. A set of input registers 505 can be configured to store a second matrix X. For example, if the second matrix X includes r rows, the set of input registers 505 can include r input registers, wherein each input register in the set stores n bit values of a respective element of the second matrix X.

The input registers 505 can be coupled to the word line drivers 510 and can be associated with respective word lines. The readout circuitry 520 can be coupled to respective bit lines, and or optionally to respective source lines. In one implementation, the readout circuitry 520 can include one or more sets of sense amplifiers coupled to respective bit lines and/or source lines. The sense amplifiers can be configured to digitize the readout current on the bit lines into binary values that are supplied to the respective accumulators 525. In one implementation, the accumulators 525 can be two operand adders configured to receive binary values from a respective set of readout circuitry 520 as a first operand, the content of the respective shift register 530 as a second operand, and providing the sum thereof as an output to the respective shift register 530.

The word line drivers 510 can be configured to sequentially bias the respective set of word lines based on bit values of sequential bit positions in corresponding input registers 505. The word line drivers 510 are configured to activate one word line at a time. When a word line is activated, the output on the bit lines can be equivalent to the binary data stored in the memory cells coupled to the activated word line.

In one implementation, the word line drivers 510 can bias a first word line based on the bit values from the most-significant bit to the least-significant bit in the first input register, and then proceed with biasing each successive word line based on the corresponding input register. In another implementation, the word line drivers 510 can bias a first word line based on the bit values from the least-significant bit to the most-significant bit in the first input register, and then proceed with biasing each successive word line based on the corresponding input register. For example, if a current bit in the input register 505 is a '1' the corresponding word line can be activated by the word line drivers 510 and the output on the bit lines will be the '0' or '1' state of the respective cell corresponding to multiplication by '1'. If the current bit in the input register 505 is a '0' the corresponding word line is not activated by the word line driver 510 and the output on the bit lines will be '0' corresponding to multiplication by '0'.

In another implementation, the word line drivers 510 can bias the word lines sequentially from the first word line in the set to the last word line based on the bit value of a given bit position in the set of respective input registers, and then repeat the biasing of the successive word lines for each bit position in the input register starting from the most-significant-bit to the least-significant-bit in the set of input registers. In yet another implementation, the word line drivers 510 can bias the word lines sequentially from the first word line in the set to the last word line based on the bit value of a given bit position in the set of respective input registers, and then repeat the biasing of the successive word lines for each bit position in the input registers starting from the least-significant-bit to the most-significant bit in the set of input registers.

The readout circuitry 520 can be configured to sense one or more sets of respective bit lines to determine partial products for each set of respective bit lines in response to the word line drivers 510 sequentially biasing each word line for each bit position in the corresponding input register. Each set of bit lines can also be referred to as a compute slice. Each accumulator 525 can be configured to sum each partial product to the current content of a corresponding shift register 530 and then load the sum into the corresponding shift register 530. Each shift register 530 can be configured to shift the sum in a given direction. For example, if the word line driver 510 biases the word lines based on the input registers 505 sequenced from most-significant-bit to least-significant bit, the shift register 530 can shift the content therein one bit to the left after each time the sum from the accumulator 525 is loaded into the shift register 530. If the input registers 505 are sequenced from least-significant-bit to most-significant-bit, the shift register 530 can perform a right shift on the sum. After sequencing over the word lines and over the bit positions of the input buffer, the resulting dot product of the first and second matrix can be output form the one or more shift registers 530.

Figure 6A:
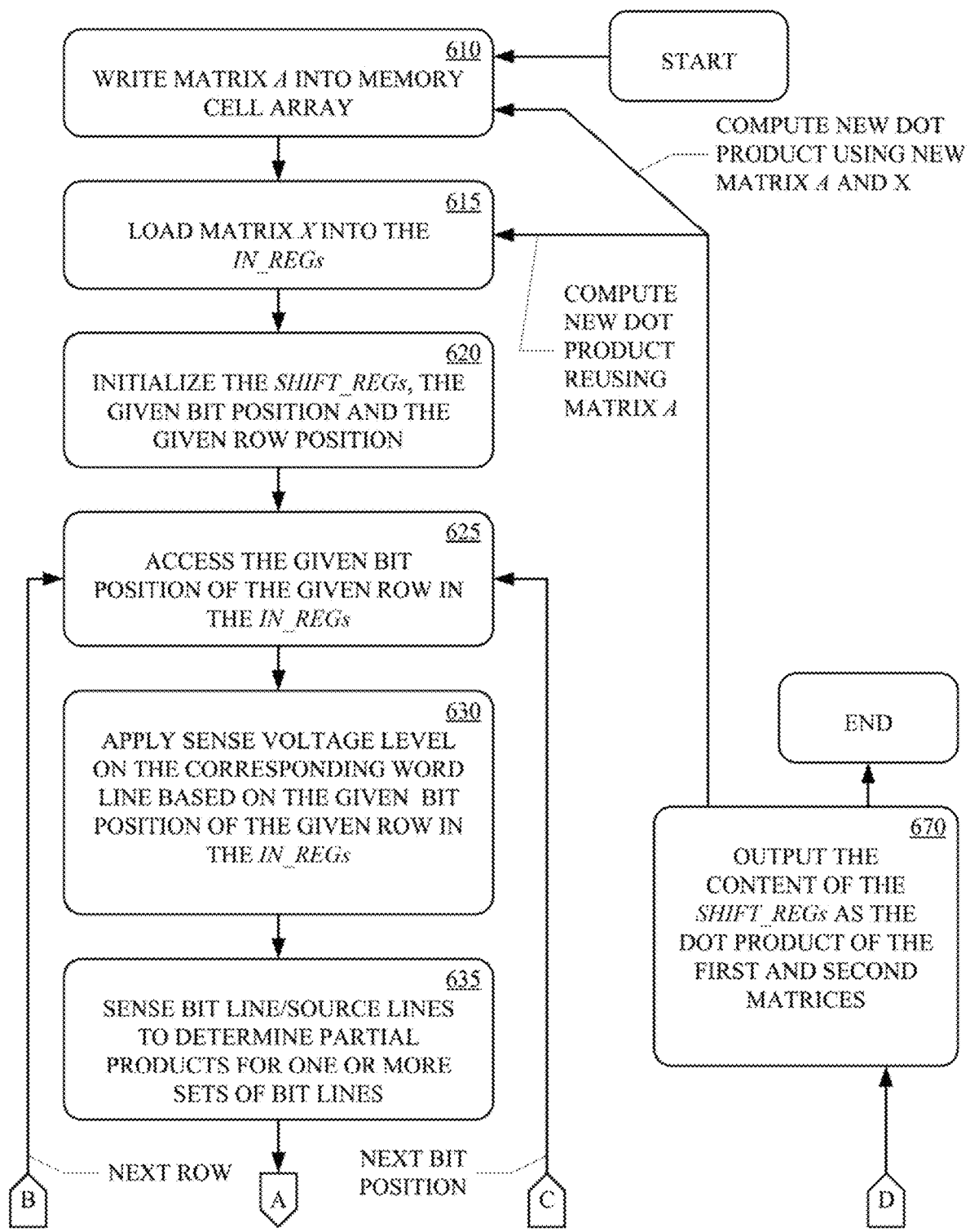
FIGS. 6A and 6B show a method of computing a dot product in a memory device, in accordance with aspects of the present technology.
Figure 6B:
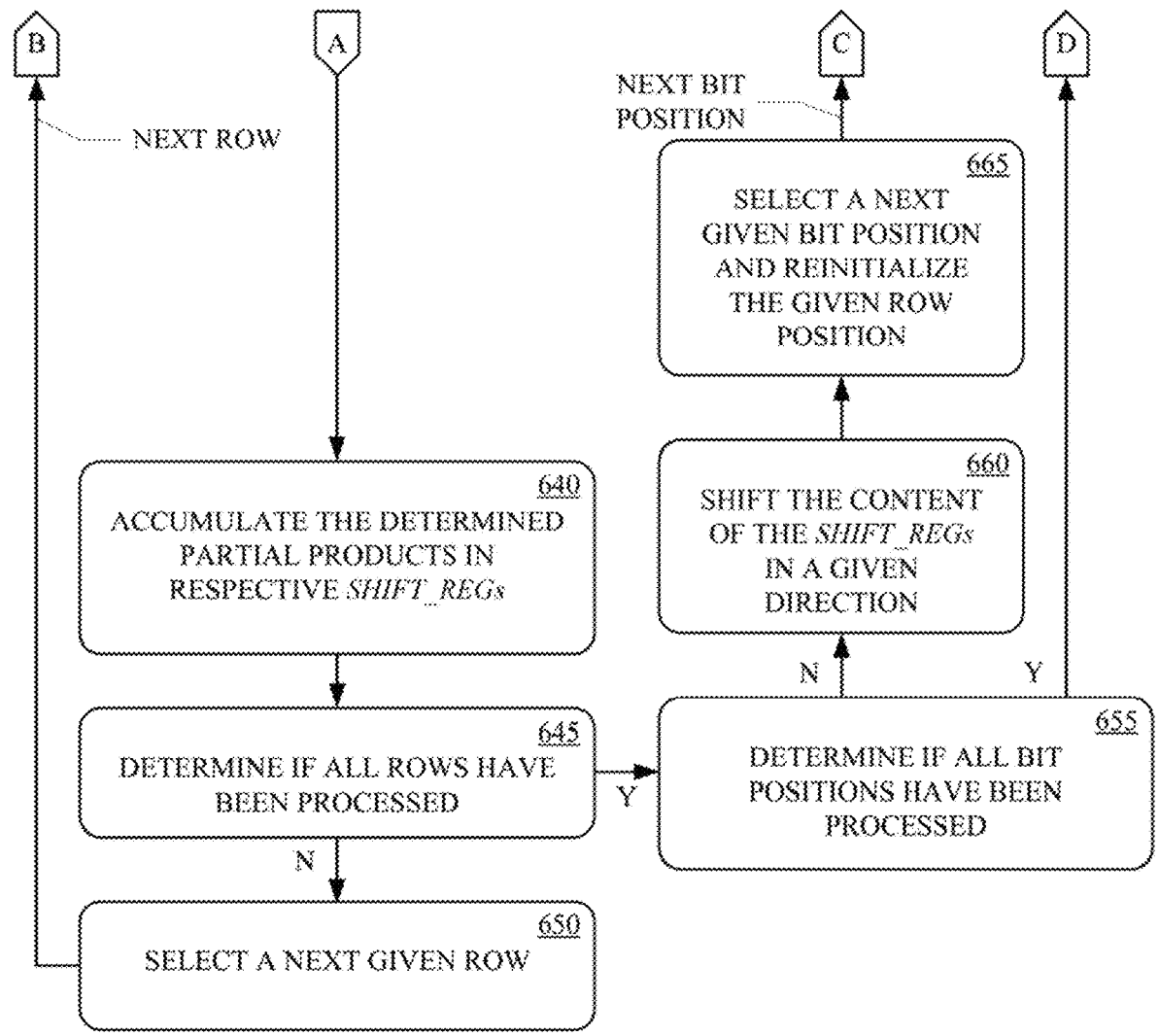

Referring now to FIGS. 6A and 6B, a method of computing a dot product, in accordance with aspects of the present technology, is shown. The method can begin with loading a first matrix A into a memory cell array, at 610. The first matrix A can be loaded at a set of word lines and one or more sets of bit lines of the memory cell array. At 615, a second matrix X can be loaded into a set of input registers IN_REGs associated with respective ones of the set of word lines. At 620, one or more shift registers SHIFT_REGs can be initialized be setting the content to zero or any other predetermined value. Optionally one or more additional initializations can be performed. For example, a bit position j counter and a row i counter can also be set to corresponding predetermined values. In one implementation, the bit position j counter and the row i counter can beset to zero. Although the method of computing the dot product is described with reference to a count up bit position j counter, the method could be readily modified to use a count down bit position j counter. Similarly, either a count up or count down row i counter can be utilized. In addition, any other applicable technique for sequencing the bit positions and the rows can be utilized.

At 625, a given bit in the input register for a given row can be accessed. In one implementation, the bit position in the input register corresponding to the current value of the $j^{th}$ bit position in the $i^{th}$ input register can be accessed. At 630, a sense voltage level based on a given sequence of bit positions in a given input register can be applied to a respective word line. For example, a sense voltage based on the $j^{th}$ bit position in the $i^{th}$ input register can be applied to the $i^{th}$ row of the word lines. In one implementation, if the $j^{th}$ position in the $i^{th}$ input register is a logic '1', a high voltage potential can be applied to the $i^{th}$ word line. If the $j^{th}$ position in the $i^{th}$ input register is a logic '0', a low voltage potential can be applied to the $i^{th}$ word line.

At 635, one or more sets of bit lines can be sensed in response to each sequence of applied sense voltage levels to determine partial products for each corresponding set of bit lines. At 640, the determined partial products for each respective set of bit lines can be accumulated. In one implementation, the current determined partial product can be summed with the current content of a respective shift register SHIFT_REG and loaded into the shift register. At 645, it can be determined if all rows have been processed. In one implementation, the row i counter can be incremented, and then it can be determined if the row i counter is equal to the number of rows r of the matrices. If all the rows have not been processed, a next given row can be selected at 650, and the processes at 625-645 can be repeated as applicable. In one implementation, if the row i count is not equal to the number of rows r of the matrices, the row i count can be incremented and the processes at 625-645 can be repeated.

If all the rows have been processed, it can be determined if all bit positions have been processed, at 655. In one implementation, it can be determined if the bit position j counter is equal to the number of bits n of matrix X values. If all the bit positions have not been processed, the accumulated partial product can be shifted, at 660. In one implementation, the current content of the shift register can be shifted to the left when the input register is accessed from the most-significant bit to the least-significant bit. At 665, a next given bit position can be selected, the given row position can be reinitialized and the processes at 625-655 can be repeated as applicable. In one implementation, if the bit position j count is not equal to the number of bits n of matrix X values, the row i counter can be reset to zero and the bit position j counter can be incremented. If all the bit positions have been processed, the current content of the one or more shift registers can be output as a dot product of the first matrix A and the second matrix X, at 670. In one implementation, if the bit position j is equal to the number of bits n of the matrix X values, the current content of the one or more shift registers can be output as a dot product of the first matrix A and the second matrix X.

In some implementations, the same matrix A can be utilized to compute dot products for different instances of matrix X. In such implementations, matrix A can be written into the memory cell array once. Thereafter, the processes at 615-670 can be repeated for each instance of matrix X.

Figure 7A:
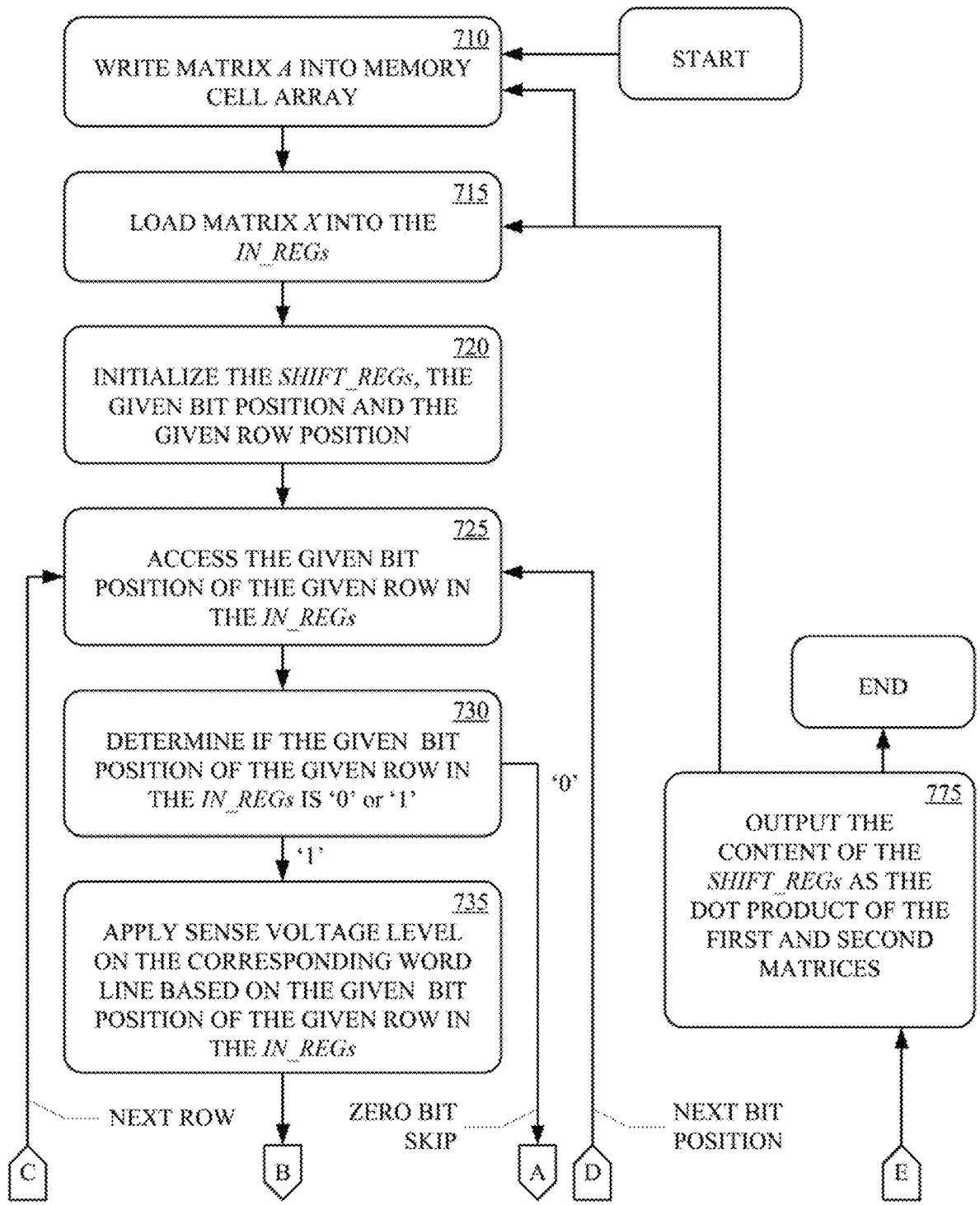
FIGS. 7A and 7B show a method of computing a dot product in a memory device, in accordance with aspects of the present technology.
Figure 7B:
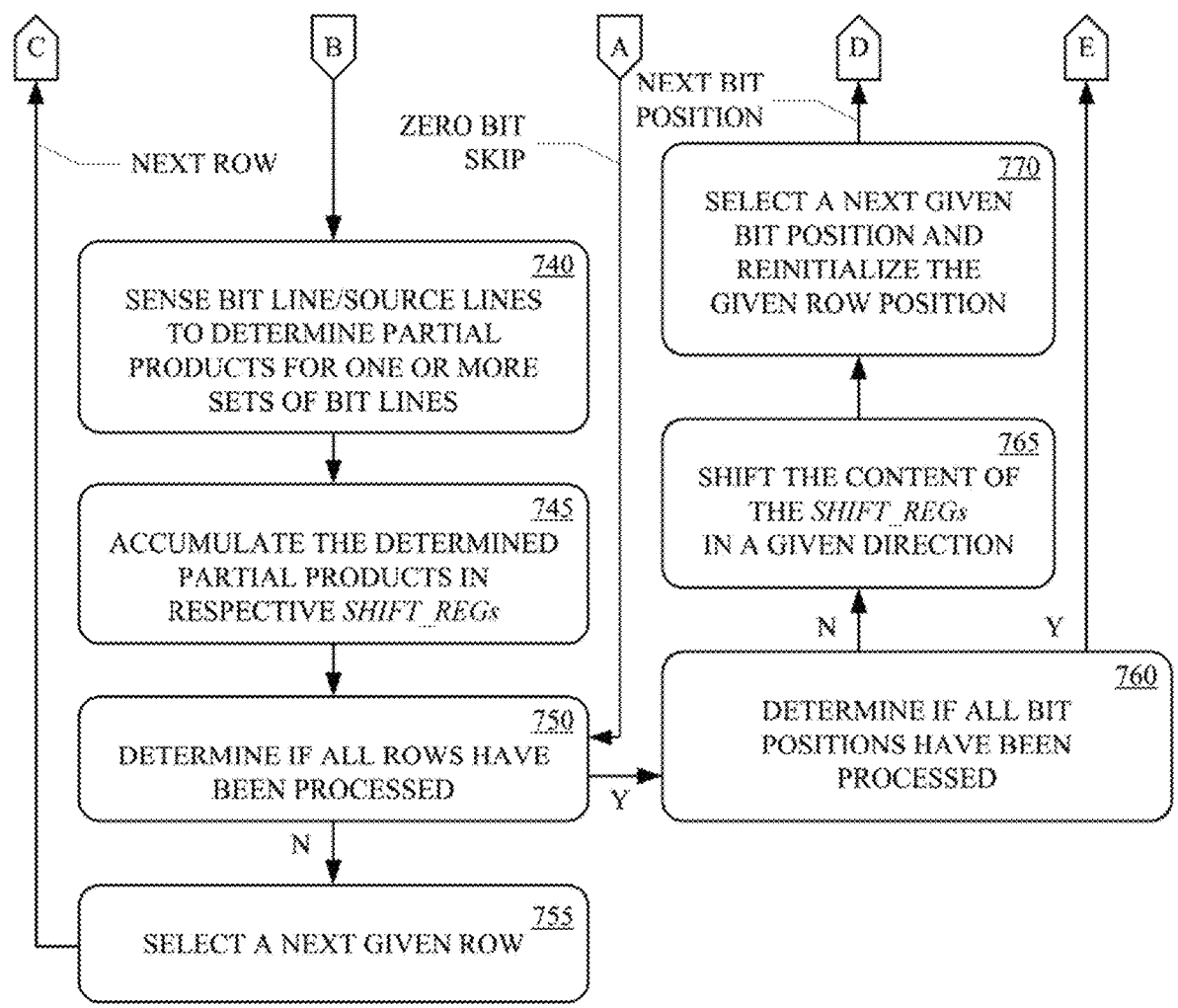

Referring now to FIGS. 7A and 7B, a method of computing a dot product, in accordance with aspects of the present technology, is shown. The method is substantially similar to the method described with reference to FIGS. 6A and 6B, and can begin with loading a first matrix A into a memory cell array, at 710. At 715, a second matrix X can be loaded into a set of input registers IN_REGs associated with respective word lines. At 720, one or more shift registers SHIFT_REGs can be initialized be setting the content to zero or any other predetermined value. Optionally one or more additional initializations can be performed. For example, a bit position j counter and a row i counter can also be set to a predetermined value. In one implementation, the bit position j counter and the row i counter can beset to zero. Although the method of computing the dot product is described with reference to a count up bit position j counter, the method could be readily modified to use a count down bit position j counter. Similarly, either a count up or count down row i counter can be utilized. In addition, any other applicable technique for sequencing the bit positions and the rows can be utilized.

At 725, a given bit in the input register for a given row can be accessed. In one implementation, the bit position in the input register corresponding to the current value of the $j^{th}$ bit position in the $j^{th}$ input register can be accessed. At 730, it can be determined if logic state of the given bit in the input register for the given row is a logic '1' or a logic '0' if the given bit in the input register for the given row is a logic '1', a high sense voltage potential can be applied to the $i^{th}$ word line, at 735.

At 740, one or more sets of bit lines can be sensed, in response to the applied high sense voltage when the given bit in the input register is a logic '1,' to determine partial products for each corresponding set of bit lines. At 745, the determined partial products of a respective set of bit lines can be accumulated. In one implementation, the current determined partial product can be summed with the current content of a respective shift register SHIFT_REG and loaded into the shift register. At 750, it can be determined if all rows have been processed. In one implementation, the row i counter can be incremented, and then it can be determined if the row i counter is equal to the number of rows r of the matrices. If the given bit in the input register for the given row is a logic '0,' as determined at process 730, the processes of 735-745 can be skipped and it can be determined if all rows have been processed, at 750. If all the rows have not been processed, a next given row can be selected at 755, and the processes at 725-750 can be repeated as applicable. In one implementation, if the row i count is not equal to the number of rows r of the matrices, the row i count can be incremented and the processes at 725-755 can be repeated.

If all the rows have been processed, it can be determined if all bit positions have been processed, at 760. In one implementation, it can be determined if the bit position j counter is equal to the number of bits n of matrix X values. If all the bit positions have not been processed, the accumulated partial product can be shifted, at 765. In one implementation, the current content of the shift register can be shifted to the left when the input register is accessed from the most-significant bit to the least-significant bit. At 770, a next given bit position can be selected, the given row position can be reinitialized and the processes at 625-760 can be repeated as applicable. In one implementation, if the bit position j count is not equal to the number of bits n of matrix X values, the rows i counter can be reset to zero and the bit position j counter can be incremented. If all the bit positions have been processed, the current content of the one or more shift registers can be output as the dot product of the first matrix A and the second matrix X, at 775. In one implementation, if the bit position j is equal to the number of bits n of matrix X values, the current content of the shift register can be output as a dot product of the first matrix A and the second matrix X.

In some implementations, the same matrix A can be utilized to compute dot products for different instances of matrix X. In such implementations, matrix A can be written into the memory cell array once. Thereafter, the processes at 715-775 can be repeated for each instance of matrix X.

Figure 8A:
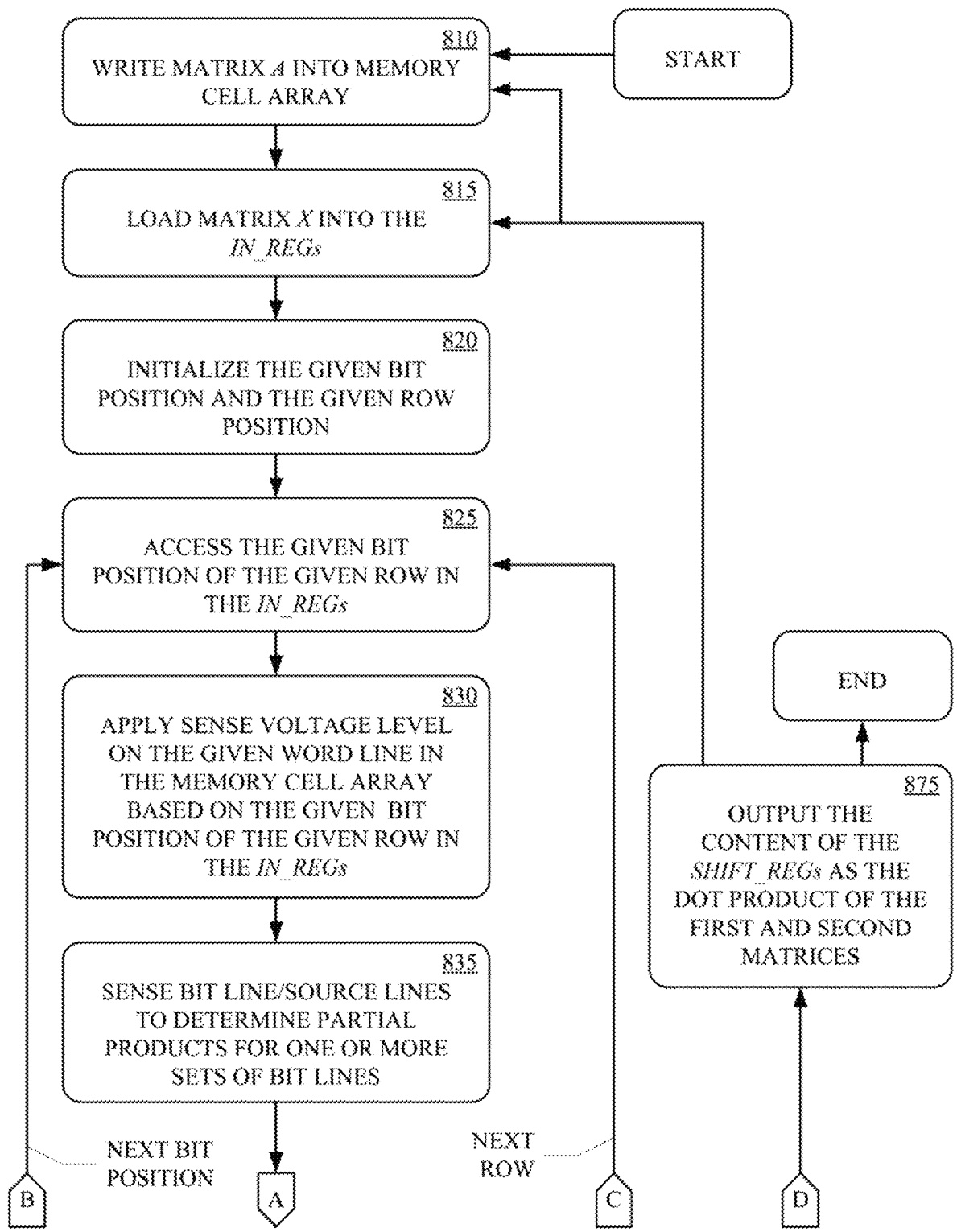
FIGS. 8A and 8B show a method of computing a dot product in a memory device, in accordance with aspects of the present technology.
Figure 8B:
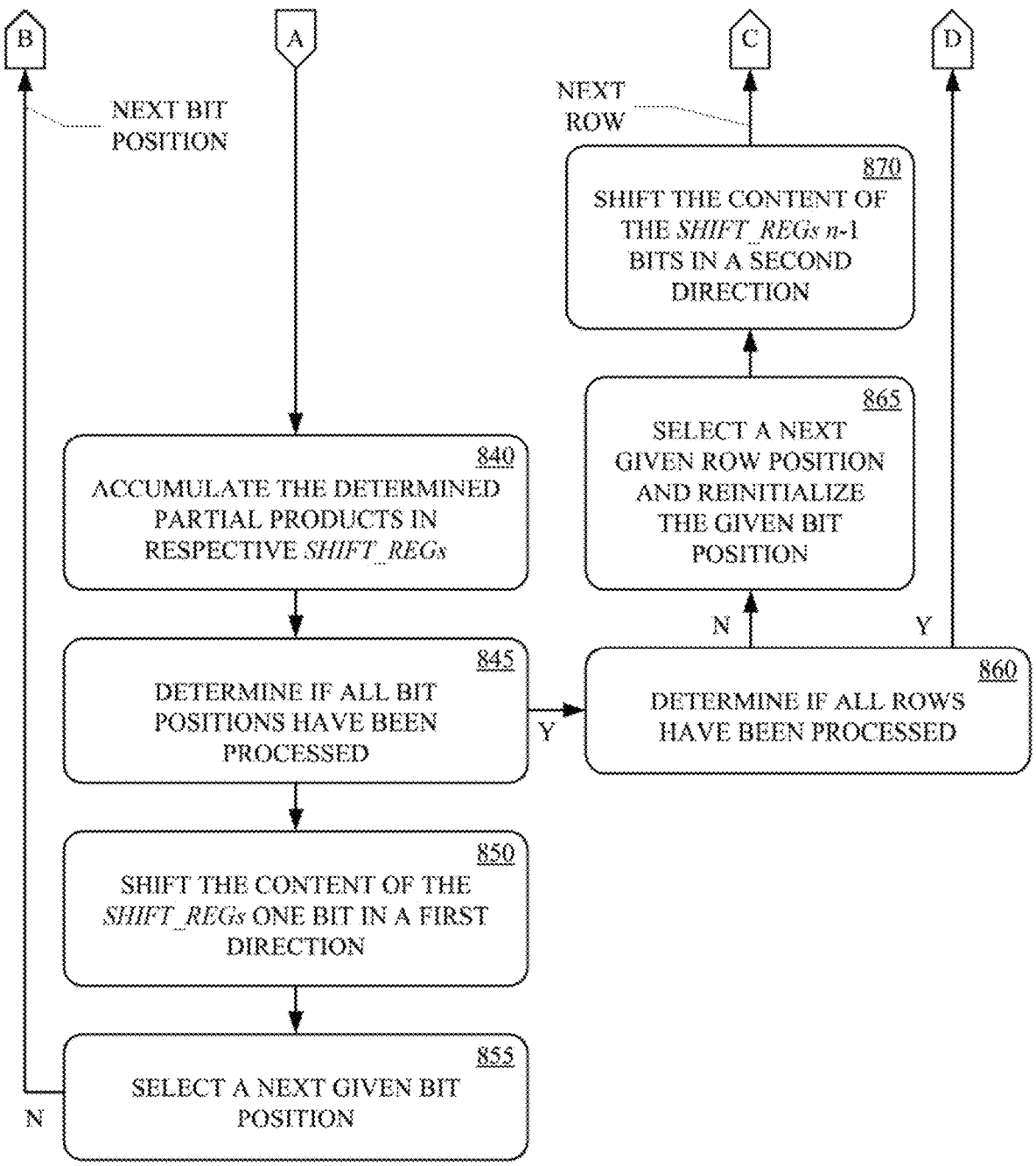

Referring now to FIGS. 8A and 8B, a method of computing a dot product, in accordance with aspects of the present technology, is shown. The method can begin with loading a first matrix A into a memory cell array, at 810. At 815, a second matrix X can be loaded into a set of input registers IN_REGs associated with respective ones of the set of word lines. At 820, one or more shift registers SHIFT_REGs can be initialized be setting the content to zero or any other predetermined value. Optionally one or more additional initializations can be performed. For example, a bit position j counter and a row i counter can also be set to a predetermined value. In one implementation, the bit position j counter can be set to one less than the number of bits n of matrix X values, and the row i counter can be set to zero. Although the method of computing the dot product is described with reference to a count down bit position j counter, the method could be readily modified to use a count up bit position j counter. Similarly, either a count up or count down row i counter can be utilized. In addition, any other applicable technique for sequencing the bit positions and the rows can be utilized.

At 825, a given bit in the input register for a given row can be accessed. In one implementation, the bit position in the input register corresponding to the current value of the $j^{th}$ bit position in the $i^{th}$ input register can be accessed. At 830, a sense voltage level based on a given sequence of bit positions in a given input register can be applied to a respective word line. For example, a sense voltage based on the $j^{th}$ bit position in the $i^{th}$ input register can be applied to the $i^{th}$ row of the word lines. In one implementation, if the $j^{th}$ position in the $i^{th}$ input register is a logic '1', a high voltage potential can be applied to the $i^{th}$ word line. If the $j^{th}$ position in the a input register is a logic '0', a low voltage potential can be applied to the $i^{th}$ word line.

At 835, one or more sets of bit lines can be sensed in response to each sequence of applied sense voltage levels to determine partial products from each set of bit lines for each sequence of applied sense voltage levels. At 840, the determined partial products of a respective set of bit lines can be accumulated. In one implementation, the current determined partial product can be summed with the current content of a respective shift register SHIFT_REG and loaded into the shift register. At 845, it can be determined if all bit positions have been processed. In one implementation, the bit position j counter can be decremented, and then it can be determined if the bit position j count is less than zero. If all the bit positions have not been processed, the accumulated partial product can be shifted in a first direction one bit position, at 850. In one implementation, the current content of the shift register can be shifted to the left one bit position when the input register is accessed from the most significant bit to the least-significant bit. At 855, a next given bit position can be selected and the processes at 825-845 can be repeated as applicable. In one implementation, if the bit position j count is not less than zero, the processes at 825-845 can be repeated to determine a partial product from each bit position of the respective input register for a given word line.

If all the bit positions have been processed, it can be determined if all row positions have been processed at 860. In one implementation, the row i counter can be incremented, and then it can be determined if the row i counter is equal to the number of rows r of the matrices. If all the row positions have not been processed, a next row position can be selected, and the given bit position can be reinitialized, at 865. In one implementation, the row i counter can be incremented and the bit position j counter can be reset to one less than the number of bit n of matrix X values. At 870, the current content of the shift registers can be shifted n−1 bits in a second direction, and the processes at 825-860 can be repeated as applicable. In one implementation, the current content of the shift register can be shifted to the right by n−1 bits when the input register is accessed from the most-significant bit to the least-significant bit. If all the row positions have been processed, the current content of the one or more shift registers can be output as the dot product of the first matrix A and the second matrix X, at 875. In one implementation, if the row i count is equal to the number of rows r of the matrices, the current content of the shift register can be output as a dot product of the first matrix A and the second matrix X.

In some implementations, the same matrix A can be utilized to compute dot products for different instances of matrix X. In such implementations, matrix A can be written into the memory cell array once. Thereafter, the processes at 815-875 can be repeated for each instance of matrix X.

Figure 9:
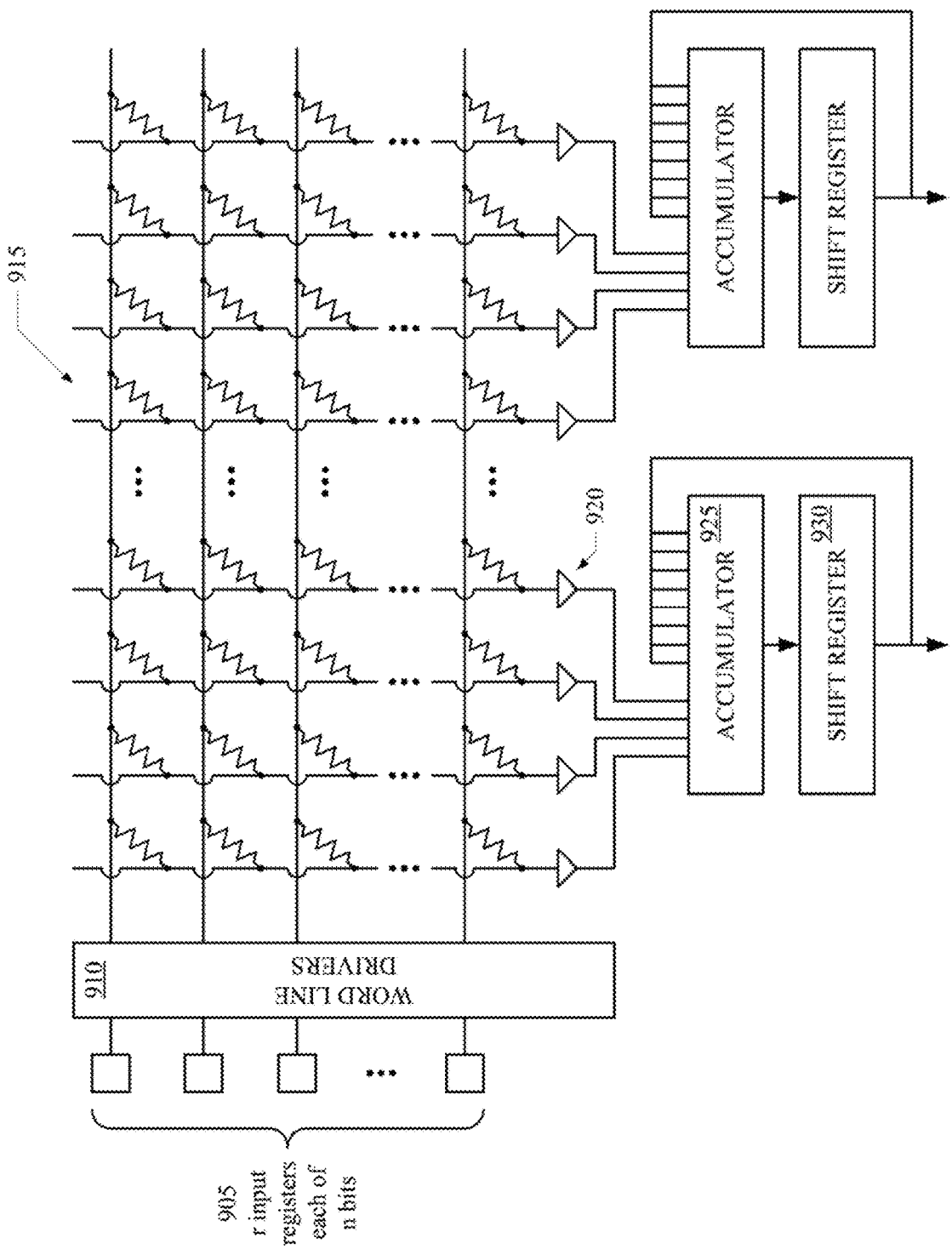
FIG. 9 shows a memory device configured to compute matrix dot products, in accordance with aspects of the present technology.

Referring now to FIG. 9, a memory device configured to compute matrix dot products, in accordance with aspects of the present technology, is shown. The memory device 900 is substantially similar to the memory device of FIG. 5, and can include one or more sets of input registers 905, word line drivers 910, an array of memory cells 915, readout circuitry 920, one or more accumulators 925, and one or more shift registers 930. A set of input registers 905 can be r register, wherein each register can store one bits of a respective element of the second matrix X. The set of input registers 905 can be configured to store the current bit of the respective element for use in performing the respective partial product. The use of a set of r single bit input registers can be adopted for implementation where the word lines are scanned in sequence first, and each bit position of the matrix values are scanned second. Generally, registers consume a relatively large amount of power and or die area as compared to other circuits of the memory device. Therefore, the use of single bit input registers 905 can reduce power consumption and or fabrication costs as compared to the memory device described with reference to FIG. 5.

The input registers 905 can be coupled to the word line drivers 910 and can be associated with respective word lines. The word line drivers 910 can be configured to sequentially bias the respective set of word lines based on the current bit values in the corresponding input registers 905. The readout circuitry 920 can be coupled to respective bit lines, and or optionally to respective source lines. The readout circuitry 920 can be configured to sense one or more sets of respective bit lines to determine partial products for each set of respective bit lines in response to the word line driver biasing each word line for each bit position in the corresponding input register. Each accumulator 925 can be configured to sum each partial product to the current content of a corresponding shift register 930 and then load the sum into the corresponding shift register 930. Each shift register 930 can be configured to shift the sum in a given direction. After sequencing over the word lines and over the bits of the input buffer, the resulting dot product of the first and second matrix can be output from the shift register 930.

Figure 10:
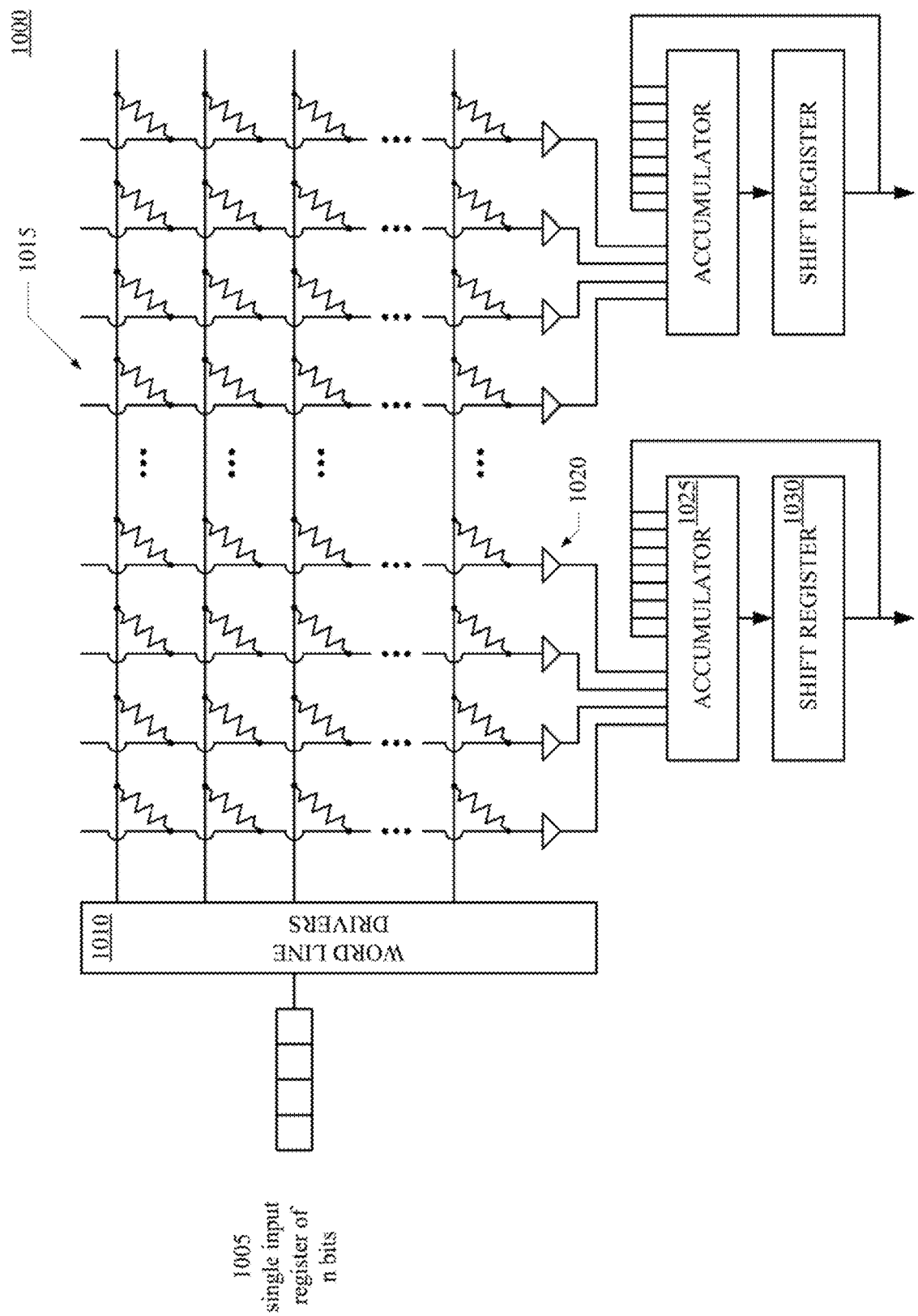
FIG. 10 shows a memory device configured to compute matrix dot products, in accordance with aspects of the present technology.

Referring now to FIG. 10, a memory device configured to compute matrix dot products, in accordance with aspects of the present technology, is shown. The memory device 1000 is substantially similar to the memory device of FIG. 5, and can include an input register 1005, word line drivers 1010, an array of memory cells 1015, readout circuitry 1020, one or more accumulators 1025, and one or more shift registers 1030. An input register 1005 can store an n bit value of a given element of the second matrix X. The use of a single n bit input register can be adopted for implementation where the bits of a matrix value are scanned in sequence first, and each word line is scanned second. Generally, registers consume a relatively large amount of power and or die area as compared to other circuits of the memory device. Therefore, the use of single n bit input register 1005 can reduce power consumption and or fabrication costs as compared to the memory device described with reference to FIG. 5.

The input register 1005 can be coupled to the word line drivers 1010 and can be associated with a set of word lines. The word line drivers 1010 can be configured to sequentially bias the respective set of word lines based on the current bit value in the corresponding input register 1005. The readout circuitry 1020 can be coupled to respective bit lines, and or optionally to respective source lines. The readout circuitry 1020 can be configured to sense one or more sets of respective bit lines to determine partial products for each set of respective bit lines in response to the word line driver biasing each word line for each bit position in the input register. Each accumulator 1025 can be configured to sum each partial product to the current content of a corresponding shift register 1030 and then load the sum into the corresponding shift register 1030. Each shift register 1030 can be configured to shift the sum in a given direction. After sequencing over the word lines and over the bits of the input buffer, the resulting dot product of the first and second matrix can be output form the shift register 1030.

Figure 11:
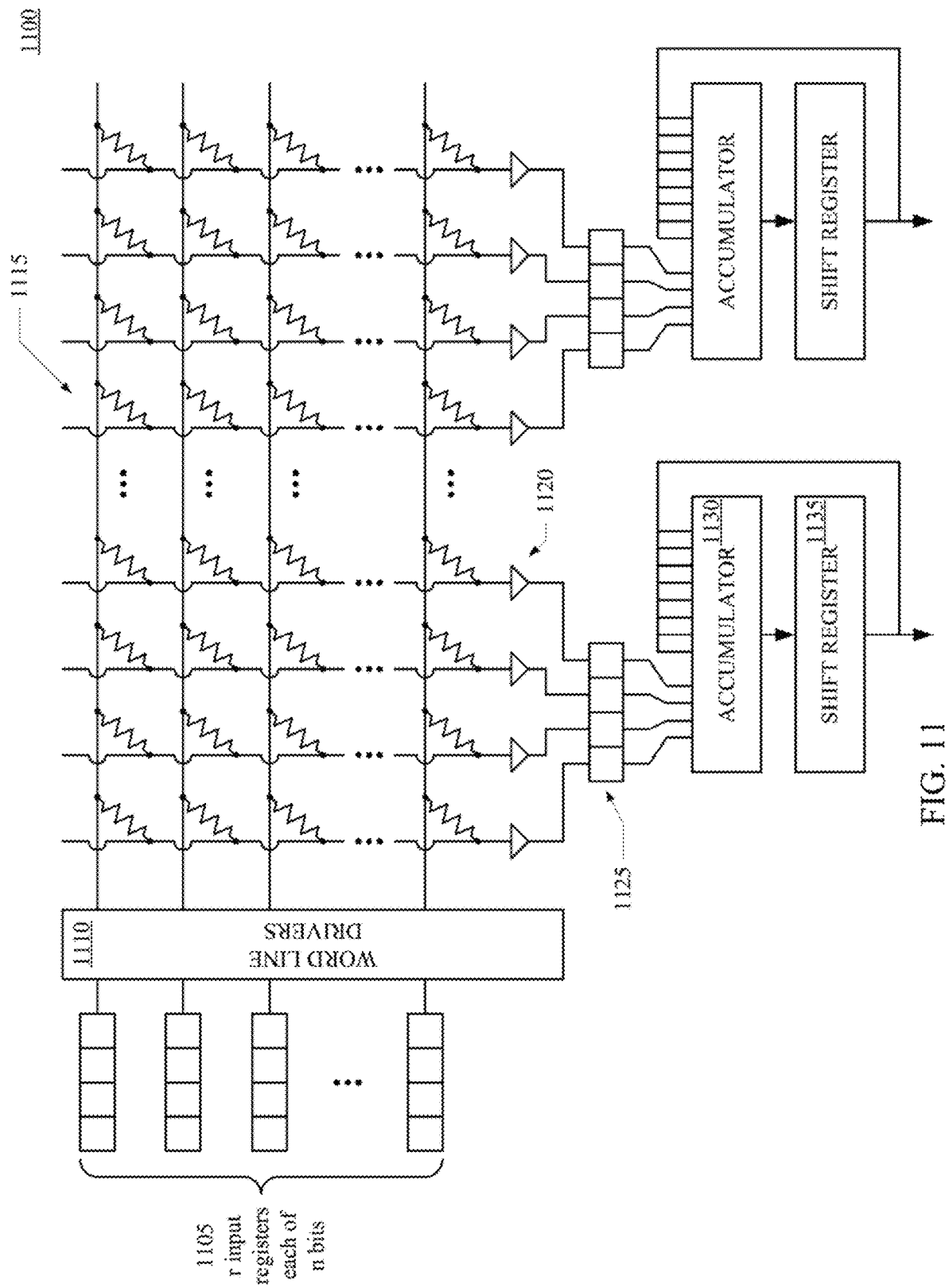
FIG. 11 shows a memory device configured to compute matrix dot products, in accordance with aspects of the present technology.

Referring now to FIG. 11, a memory device configured to compute matrix dot products, in accordance with aspects of the present technology, is shown. The memory device 1100 is substantially similar to the memory device of FIG. 5, and can include one or more sets of input registers 1105, word line drivers 1110, an array of memory cells 1115, readout circuitry 1120, one or more readout buffers 1125, one or more accumulators 1130, and one or more shift registers 1135. The input registers 1105 can be coupled to the word line drivers 1110 and can be associated with respective word lines. The readout circuitry 1120 can be coupled to respective bit lines, and or optionally to respective source lines. The readout circuitry 1120 can be configured to sense one or more sets of respective bit lines to determine partial products for each set of respective bit lines in response to the word line driver biasing each word line for each bit position in the corresponding input register. The determined partial products can be buffered in the respective readout buffers 1125. Each accumulator 1130 can be configured to sum each partial product buffered in the readout buffer 1125 to a content of a corresponding shift register 1135 and then load the sum into the shift register 1135. The readout buffers 1125 added between the readout circuitry 1120 and the accumulators 1130 provide a pipelining capability that can hide the access time of the memory cell array 1115. The readout buffers 1125 can also be used to hide the memory access overhead, where the memory can be accessed n-time less and the data in the read buffer can be reused.

Figure 12A:
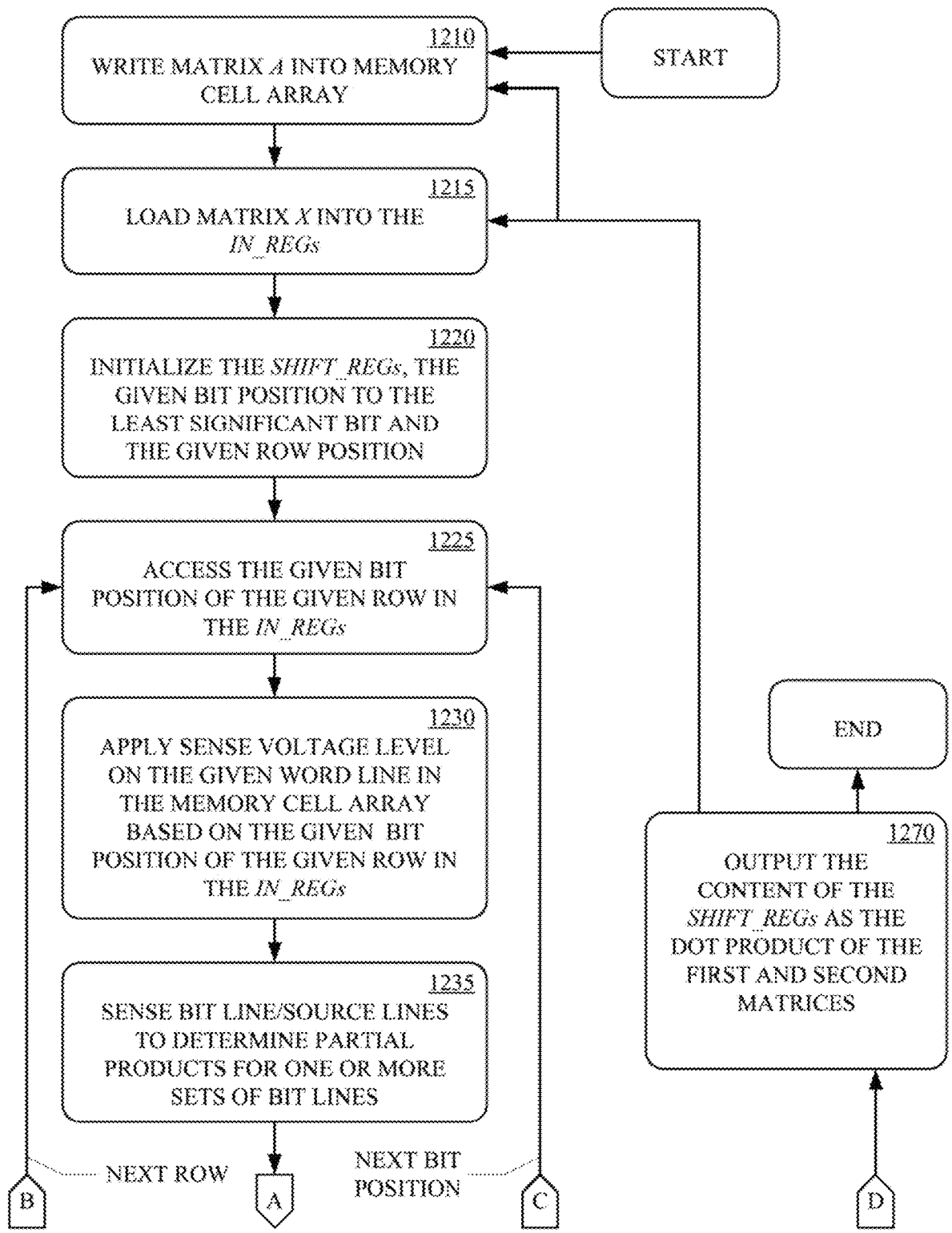
FIGS. 12A and 12B show a method of computing a dot product in a memory device, in accordance with aspects of the present technology.
Figure 12B:
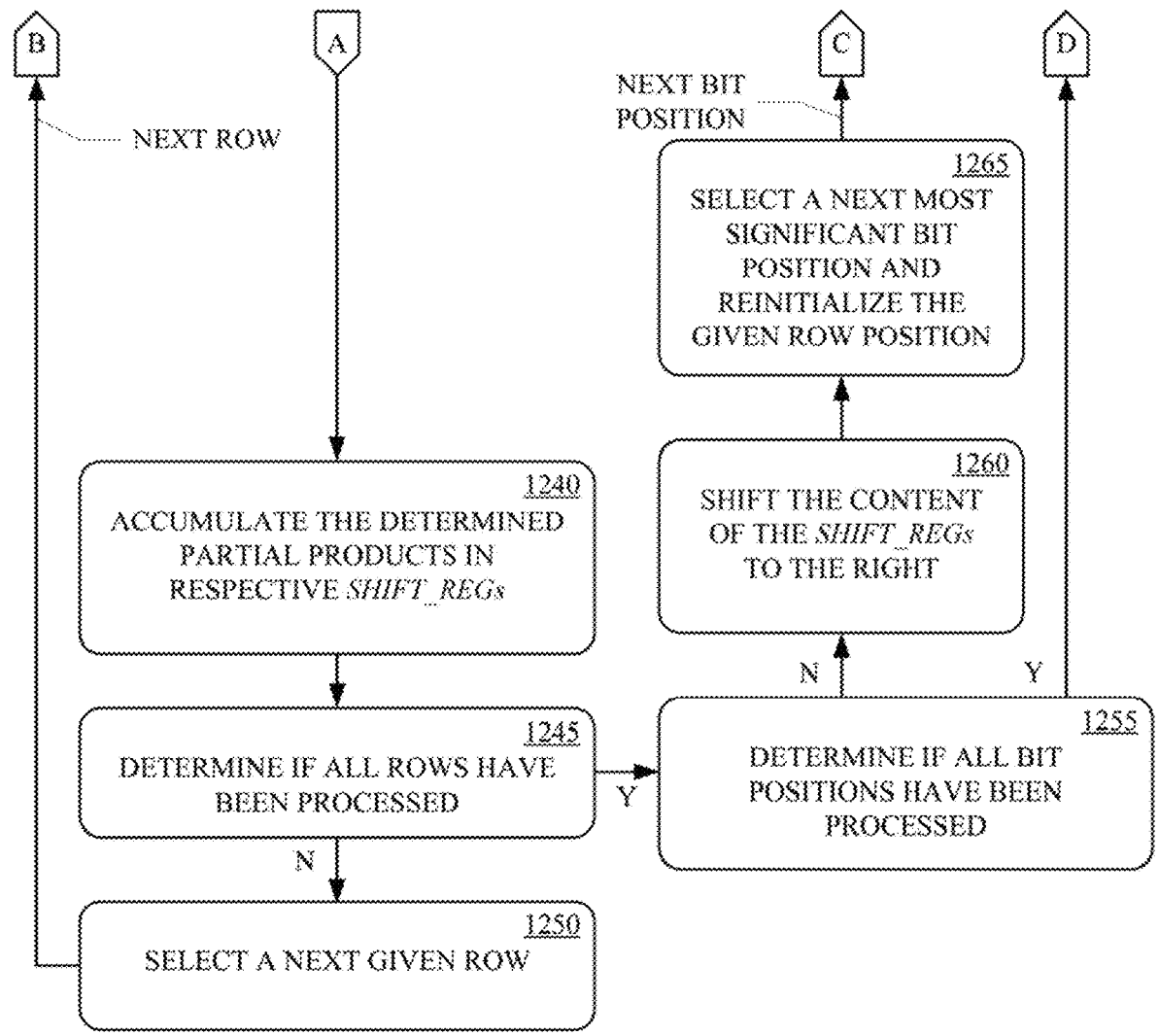

The number of output bits (OB) of the matrix dot product can be described in accordance with Equation 1 as:

$$OB \leq 2n + \log_2(r) \tag{1}$$

where n is the number of bits of the matrix elements and r is the number of rows of the matrices. However, in one or more implementations, it may be desirable to truncate the dot product to n bits. For example, the determined matrix dot product may be used as an input to a next stage. If a scaling technique is adopted, the lowest significant bits can be truncated so that the result of the dot product is an n bit value. Referring now to FIGS. 12A and 12B, a method of computing a dot product in a memory device, in accordance with aspects of the present technology, is shown. The method can begin with loading a first matrix A into a memory cell array, at 1210. At 1215, a second matrix X can be loaded into a set of input registers IN_REGs associated with respective ones of the set of word lines. At 1220, one or more shift registers SHIFT_REGs can be initialized by setting the content to zero, or any other predetermined value. In addition, an indication of a given bit position can be initialized to the least-significant bit (LSB) position. For example, a bit position j counter can be set to a predetermined value indicative of the least-significant bit position. Optionally one or more additional initializations can be performed. For example, a row i counter can also be set to a predetermined value. In one implementation, the row i counter can be set to zero.

At 1225, a given bit in the input register for a given row can be accessed. In one implementation, the bit position of the input register corresponding to the current value of the $j^{th}$ bit position in the $i^{th}$ input register can be accessed. In one implementation, as the processes described herein are performed, the input register for each given row can be accessed starting from the least-significant bit position to the most significant bit position. At 1230, a sense voltage level based on a given sequence of bit positions in a given input register can be applied to a respective word line. For example, a sense voltage based on the $j^{th}$ bit position in the $i^{th}$ input register can be applied to the $i^{th}$ row of the word lines. In one implementation, if the $i^{th}$ position in the $i^{th}$ input register is a logic '1', a high voltage potential can be applied to the $i^{th}$ word line. If the $j^{th}$ position in the $i^{th}$ input register is a logic '0', a low voltage potential can be applied to the $i^{th}$ word line.

At 1235, one or more sets of bit lines can be sensed in response to each sequence of applied sense voltage levels to determine partial products for each corresponding set of bit lines. At 1240, the determined partial products of a respective set of bit lines can be accumulated. In one implementation, the current determined partial product can be summed with the current content of a respective n-bit shift register SHIFT_REG and loaded into the shift register. At 1245, it can be determined if all rows have been processed. In one implementation, the row i counter can be incremented, and then it can be determined if the row i counter is equal to the number of rows r of the matrices. If all the rows have not been processed, a next given row can be selected at 1250, and the processes at 1225-1245 can be repeated as applicable. In one implementation, if the row i count is not equal to the number of rows r of the matrices, the processes at 1225-1245 can be repeated.

If all the rows have been processed, it can be determined if all bit positions have been processed, at 1255. In one implementation, it can be determined if the bit position j counter is equal to the number of bits n of matrix X values. If all the bit positions have not been processed, the accumulated partial product can be shifted to the right, at 1260. At 1265, a next most significant bit position can be selected, the given row position can be reinitialized and the processes at 1225-1255 can be repeated as applicable. In one implementation, if the bit position j count is not equal to the number of bits n of matrix X values, the row i counter can be reset to zero and the bit position j counter can be incremented. If all the bit positions have been processed, the current content of the one or more shift registers can be output as a dot product of the first matrix A and the second matrix X, at 1270. In one implementation, if the bit position j is equal to the number of bits n of matrix X values, the current content of the shift register can be output as a dot product of the first matrix A and the second matrix X. Right shifting the sum of the partial products in the shift register provides for limiting the output of the dot product to an n-bit value. The above described method of FIG. 12 has been described with reference accessing the input register from the LSB to the most-significant bit (MSB) and calculating the partial products starting with the LSB. However, the method could be readily modified to access the input register from MSB to LSB and calculating the partial product starting with the MSB.

In some implementations, the same matrix A can be utilized to compute dot products for different instances of matrix X. In such implementations, matrix A can be written into the memory cell array once. Thereafter, the processes at 1215-1270 can be repeated for each instance of matrix X.

Figure 13:
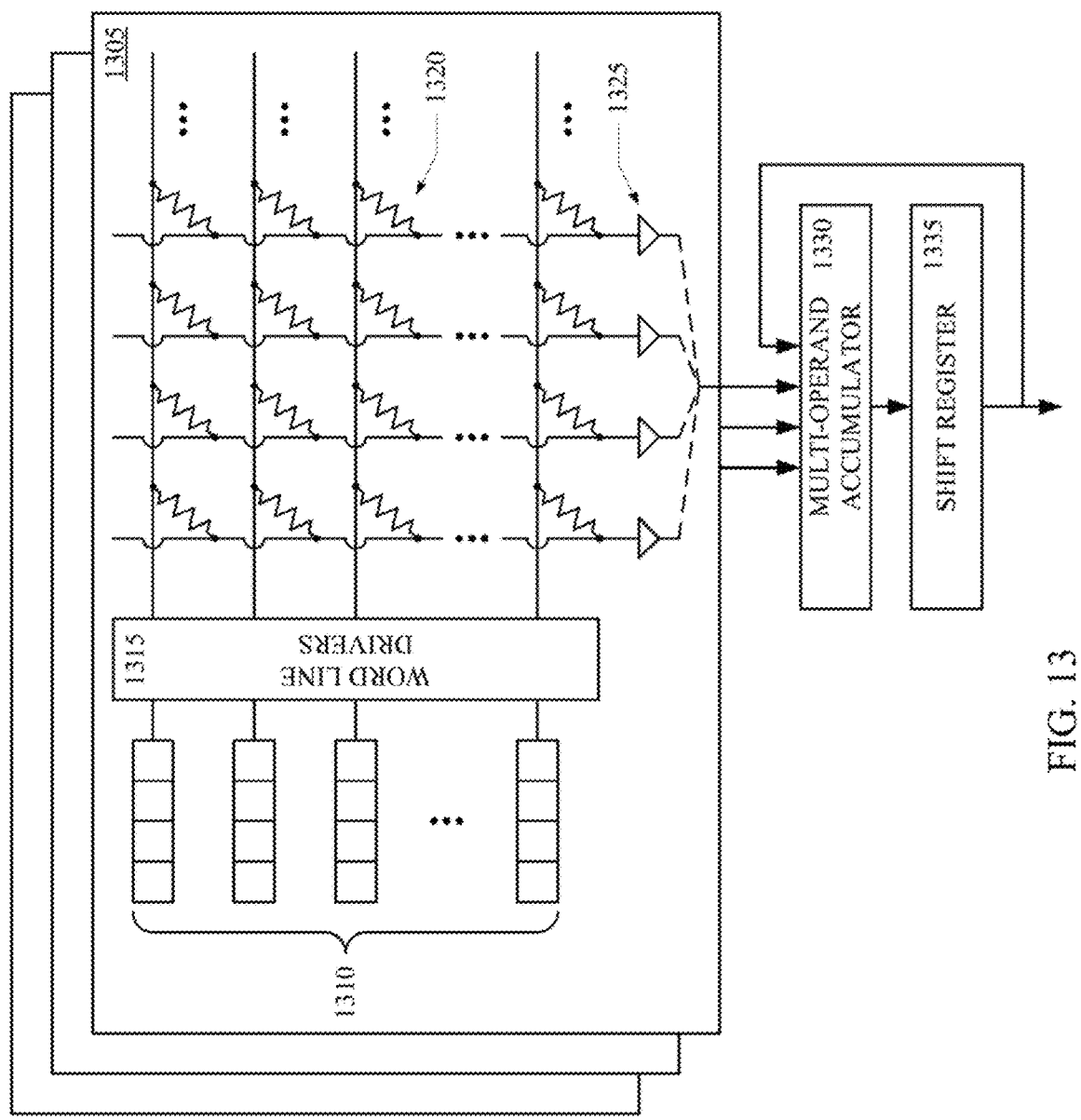
FIG. 13 shows a memory device configured to compute matrix dot products, in accordance with aspects of the present technology.

Referring now to FIG. 13, a memory device configured to compute matrix dot products, in accordance with aspects of the present technology, is shown. The memory device 1300 can include one or more sets of array units 1305. Each array unit 1305 can include one or more sets of input registers 1310, word line drivers 1315, an array of memory cells 1320, and readout circuitry 1325. Each set of array units 1305 can be coupled to a respective multi-operand accumulators 1330, and respective shift register 1335. The multi-operand accumulators 1330 can be carry-save adders, Wallace trees, or the like.

Respective word lines in a corresponding set of cell units 1305 can be activated simultaneously. Each accumulator 1330 can be configured to sum partial products from the corresponding readout circuitry 1325 of a set of array units 1305 and the content of a corresponding shift register 1335. The sum can then be loaded back into the corresponding shift register 1335. Each shift register 1335 can be configured to shift the sum in a given direction. For example, if the word line driver 1315 biases the word lines based on the input registers 1310 sequenced from most-significant-bit to least-significant bit, the shift register 1335 can shift its content one bit to the left after each time the sum from the accumulator 1330 is loaded into the shift register 1335. If the input registers 1310 are sequenced from least-significant-bit to most-significant-bit, the shift register 1335 can perform a right shift on the sum. After sequencing over the word lines and over the bit positions of the input buffer of a set of array units 1305, the resulting dot product can be output form the shift register 1335.

The cell units can be arranged to increase the length or width of the matrix, or both dimensions. In one implementation, the cell units 1305 can be arranged horizontally to increase the width for storing larger matrices A, while having minimal impact on the hardware design of the memory device 1300. In another implementation, the cell units 1305 can be arranged vertically to increase the length of matrix A. In the vertical implementation, the multi-operand accumulator 1330 shared among the vertical compute slices can reduce the size of the accumulator 1330 and shift register 1335.

Aspects of the present technology can also be extended to partial product passing among a plurality of sets of accumulators and shift registers, or sets of multi-operand accumulators and shift registers. The sets of accumulators and shift registers, or sets of multi-operand accumulators and shift registers can be utilized to handle large matrices. In one implementation, a first set of accumulators and shift registers, or sets of multi-operand accumulators and shift registers can be configured to compute a partial product and pass the partial product to a second set of accumulators and shift registers, or sets of multi-operand accumulators and shift registers to complete the dot product calculation when the matrix is long. In another implementation, multiple sets of accumulators and shift registers, or sets of multi-operand accumulators and shift registers can also be configured to compute a wide matrix.

Figure 14:
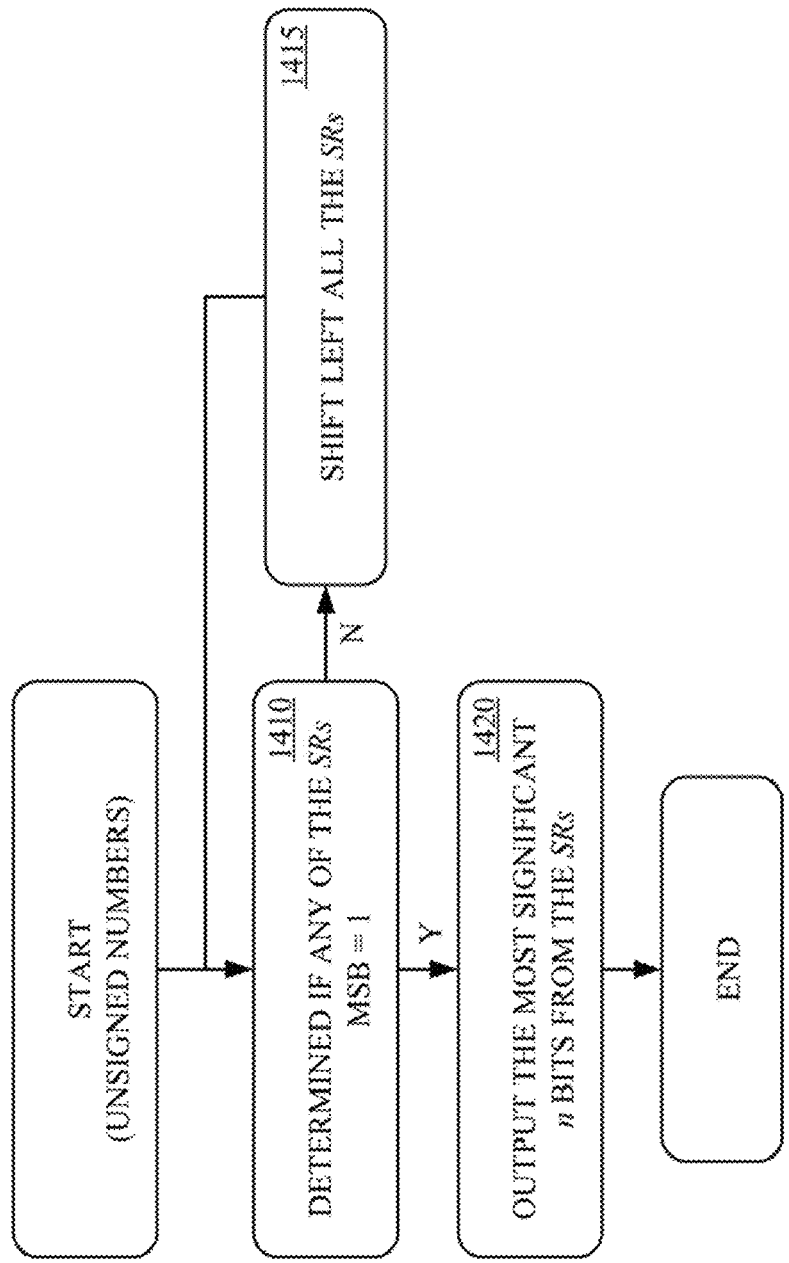
FIG. 14 shows a method of truncating the dot product in the shift register for unsigned numbers, in accordance with aspects of the present technology.

Referring now to FIG. 14, a method of truncating the dot product in the shift register for unsigned numbers, in accordance with aspects of the present technology, is shown. The method can be performed after the dot product result has been accumulated in the one or more shift registers 530, 930, 1035, 1135, 1335. The method can begin with determining if the most-significant-bit (MSB) in any of the output shift registers is equal to '1', at 1410. If none of the MSBs in the output shift registers are equal to '1', each shift register can shift the corresponding value in the shift register to the left, at 1415. After the dot product is shifted left, the process at 1410 can be repeated. When the MSB in any one of the shift register is equal to '1', the n most-significant-bits from the one or more shift registers can be output as a scaled dot product result, at 1420. The n most-significant-bits output from the shift register does not have to be the same n number of bits of the first matrix A and or second matrix X.

Figure 15:
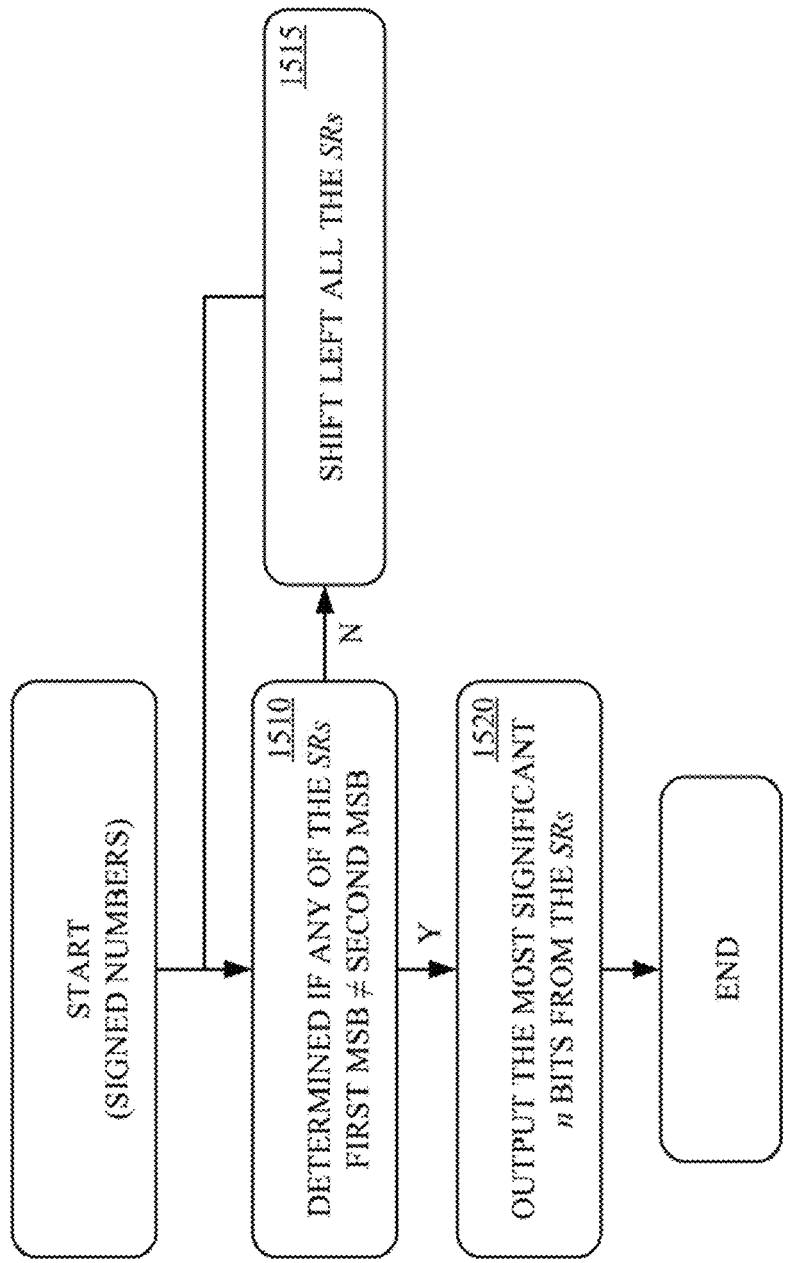
FIG. 15 shows a method of truncating the dot product in the shift register for signed numbers, in accordance with aspects of the present technology, is shown.

Referring now to FIG. 15, a method of truncating the dot product in the shift register for signed numbers, in accordance with aspects of the present technology, is shown. The method can be performed after the dot product result has been accumulated in the one or more shift registers 530, 930, 1035, 1135, 1335. The method can begin with determining if the first most-significant-bit (MSB) is not equal to the second MSB in any of the output shift registers, at 1510. If none of the first most-significant-bit (MSB) are equal to the second MSB in any of the output shift registers, each shift register can shift the corresponding value in the shift register to the left, at 1515. After the value is shifted left, the process at 1510 can be repeated. When the first most-significant-bit (MSB) is not equal to the second MSB in any one of the shift register, the n most-significant-bits from the one or more shift registers can be output as a scaled dot product result, at 1520. Again, the n most-significant-bits output from the shift register does not have to be the same n number of bits of the first matrix A and or second matrix X.

Figure 16:
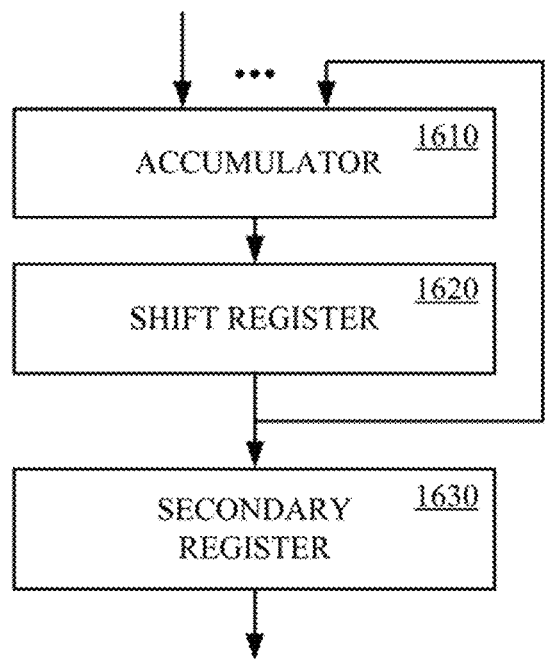
FIG. 16 shows a memory device configured to compute matrix dot products, in accordance with aspects of the present technology.

Referring to FIG. 16, a secondary register for use with the accumulators and shift registers of the memory device 500, 900, 1000, 1100, 1300, in accordance with aspects of the present technology, is shown. The one or more shift registers 1620 can be coupled to respective accumulators 1610 as described above with reference to FIGS. 5, 9, 10, 11 and 13. Secondary registers 1630 can be coupled to the output of the respective shift registers 1620. In one implementation, the one or more secondary registers 1630 can be configured to hide the access time of writing the resulting dot product back into the memory device. For example, while the accumulator 1610 and the shift register 1620 are being utilized to compute a second dot product, a first dot product can be written back to the memory array from the secondary register 1630. In the next cycle, the accumulator 1610 and the shift register 1620 can be computing a third dot product, while the second dot product is written back to the memory array from the secondary register 1630. In other implementations, the secondary register 1630 can be configured to perform operations such as max-pooling, striding, averaging or the like over successive dot product results.

Figure 17:
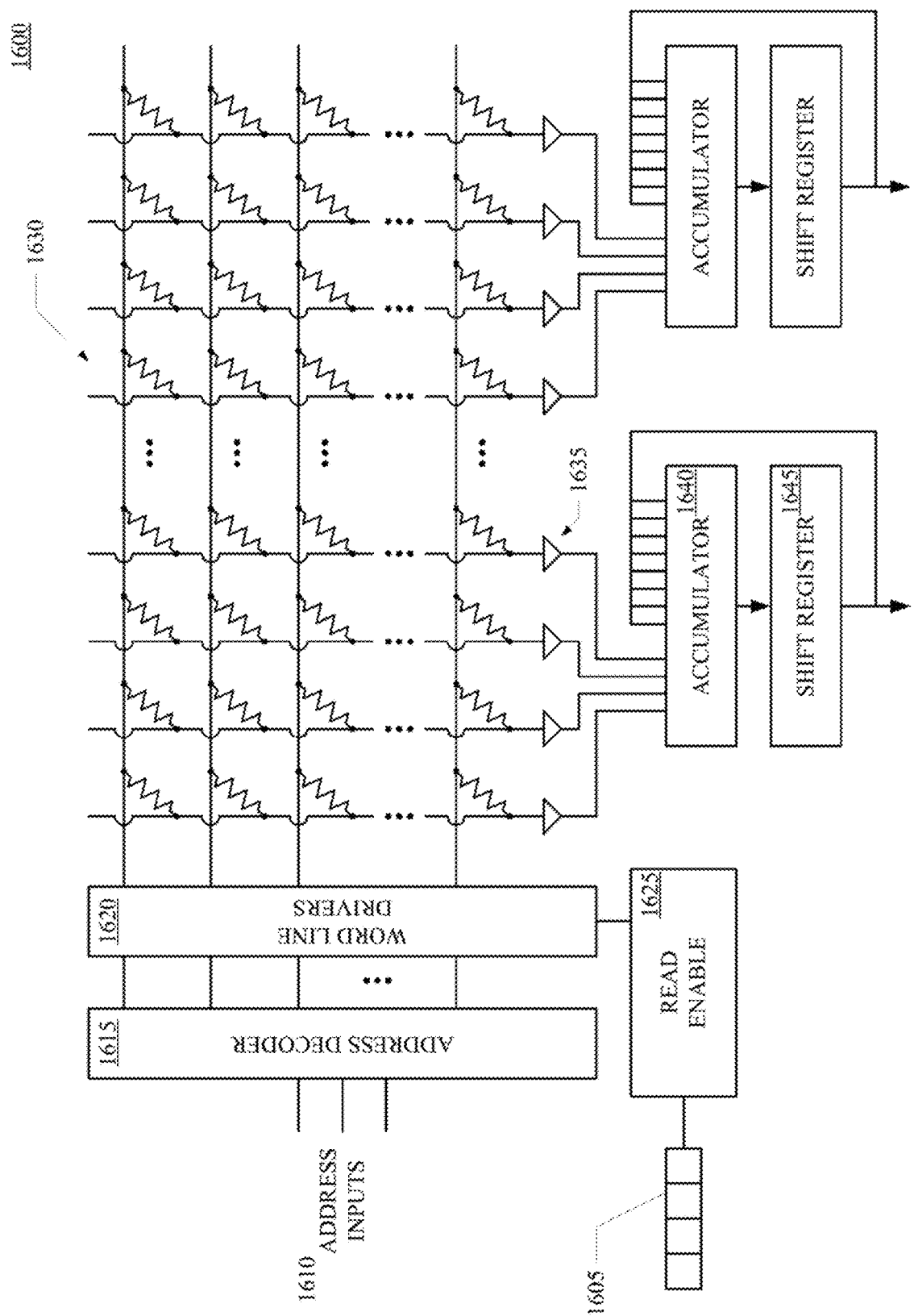
FIG. 17 shows a memory device configured to compute matrix dot products, in accordance with aspects of the present technology.

Referring now to FIG. 17, a memory device configured to compute matrix dot products, in accordance with aspects of the present technology, is shown. The memory device 1600 can include an input register 1605, address inputs 1610, address decoder 1615, word line driver 1620, read enable 1625, an array of memory cells 1630, readout circuitry 1635, one or more accumulators 1640 and one or more shift registers 1645. The input register 1605 can store an n bit value of a given element of the second matrix X The address inputs 1610 can receive an encoded address. The address decoder 1615 can decode a set of addresses. The set of decoded addresses can be configured to sequentially select a respect word line in the set of word lines for activation by the word line driver 1620. The bit values in the input register 1605 can be sequentially applied to the read enable 1625. The word line driver 1620 can be configured to sequentially bias respective word lines based on the current bit value in the corresponding input register 1605 and the current decoded address.

The readout circuitry 1635 can be coupled to respective bit lines, and or optionally to respective source lines. The readout circuitry 1635 can be configured to sense one or more sets of respective bit lines to determine partial products for each set of respective bit lines in response to the word line driver biasing each word line for each bit position in the input register. Each accumulator 1640 can be configured to sum each partial product to the current content of a corresponding shift register 1645 and then load the sum into the corresponding shift register 1645. Each shift register 1645 can be configured to shift the sum in a given direction. After sequencing over the word lines and over the bits of the input buffer, the resulting dot product of the first and second matrix can be output from the shift register 1645.

The configuration of the input register 1605 coupled to the read enable 1625 and the use of the address inputs is advantageous when access to the word lines is not provided. In such case the address on the address inputs can be used to sequentially point to the word lines and the read enable to activate the biasing the given word line based on the bit values in the input register 1605.

Memory devices in accordance with aspects of the present technology can advantageously be utilized to compute dot products in the memory device without having to read the data out to a central processing unit (CPU), graphics processing unit (GPU), digital signal processor (DSP) or the like, and writing intermediate and or final results back to memory. The memory devices can also be advantageously utilized as a conventional memory to store data for use by CPUs, GPUs, DSPs or the like. Computing matrix dot products in the memory device can advantageously reduce computation latency, memory access latency and or power consumption.

The following examples pertain to specific technology embodiments and point out specific features, elements, or steps that may be used or otherwise combined in achieving such embodiments.

Example 1 include a memory device comprising: an array of memory cells arranged in a plurality of rows of memory cells coupled to respective word lines and a plurality of columns of the memory cells coupled to respective bit lines, wherein the memory cells are configured to store a first matrix; one or more sets of input registers, wherein each set of input registers are associated with a respective set of word lines, and wherein the input registers in a set are configured to store one or more bits of one or more elements of a second matrix; word line drivers coupled to the one or more set of input registers and to corresponding sets of word lines, wherein the word line drivers are configured to sequentially bias a respective set of word lines based on bit values of sequential bit positions in a corresponding set of input registers; readout circuitry coupled to one or more sets of respective bit lines, wherein the readout circuitry is configured to sense the one or more sets of respective bit lines to determine partial products for each set of respective bit lines in response to the word line drivers biasing each word line based on each bit position in the corresponding input register; one or more accumulators coupled to the readout circuitry, wherein each accumulator is associated with a respective set of bit lines, and wherein each accumulator is configured to sum each partial product determined by the corresponding readout circuitry to a content of a corresponding shift register and load the sum into the corresponding shift register; and one or more shift register, wherein each shift register is coupled to a respective accumulator, and wherein each shift register is configured to shift the sum in a given direction after a predetermined number of sums are loaded into the shift register and to output a resulting dot product of the first and second matrix.

Example 2 includes the memory device of Example 1, wherein each set of input registers store multiple bits of respective ones of the one or more elements of the second matrix.

Example 3 includes the memory device of Example 1, wherein each set of input register sequentially store a single bit, sequentially over the bit positions of the one or more elements, of respective ones of the one or more elements of the second matrix.

Example 4 includes the memory device of Example 1, wherein each set of input registers store multiple bits of a given element, sequentially over the elements of the second matrix.

Example 5 includes the memory device of Example 1, wherein the word line drivers bias the respective set of word lines sequentially for each given bit position of the respective one or more elements of the second matrix.

Example 6 includes the memory device of Example 1, wherein the word line drivers bias each given word line based on the sequence of bits of the respective one or more elements of the second matrix.

Example 7 includes the memory device of Example 1, wherein: the sequence of the bit positions proceeds from a most significant bit to a least-significant bit; and the sum is left shifted in the shift register.

Example 8 includes the memory device of Example 1, wherein: the sequence of the bit position proceeds from a least-significant bit to a most significant bit; and the sum is right shifted in the shift register.

Example 9 includes the memory device of Example 1, further comprising: one or more readout buffers coupled between the readout circuitry and respective ones of the one or more accumulators, wherein each readout buffer is configured to provide a pipelining capability.

Example 10 includes the memory device of Example 1, further comprising: one or more secondary registers coupled to the output of a respective shift register, wherein the one or more secondary registers are configured to cache the dot product result for write back to the array of memory cells.

Example 1 includes the memory device of Example 1, further comprising: one or more secondary register coupled to the output of a respective shift register, wherein the one or more secondary registers are configured to implement one or more of max-pooling, striding, and averaging over successive dot product results.

Example 12 includes a memory device comprising: a plurality of set of array units, wherein each array unit includes; an array of memory cells arranged in a plurality of rows of memory cells coupled to respective word lines and a plurality of columns of the memory cells coupled to respective bit lines, wherein the memory cells are configured to store a first matrix; one or more sets of input registers, wherein each set of input registers are associated with a respective set of word lines, and wherein the input registers in a set are configured to store one or more bits of one or more elements of a second matrix; word line drivers coupled to the one or more set of input registers and to corresponding sets of word lines, wherein the word line drivers are configured to sequentially bias a respective set of word lines based on bit values of sequential bit positions in a corresponding set of input registers; one or more sets of accumulators, wherein each set of accumulators are coupled to the respective readout circuitry of the plurality of sets of array units, wherein each accumulator is associated with a respective set of bit lines, and wherein each accumulator is configured to sum each partial product determined by the corresponding readout circuitry to a content of a corresponding shift register and load the sum into the corresponding shift register; and one or more sets of shift register, wherein each shift register is coupled to a respective accumulator, and wherein each shift register is configured to shift the sum in a given direction after a predetermined number of sums are loaded into the shift register and to output a resulting dot product of the first and second matrix.

Example 13 includes a method of calculating a dot product in a memory device comprising: loading a first matrix into a memory cell array at a set of word lines and bit lines; loading a second matrix into a plurality of input registers associated with respective one of the set of word lines; sequentially applying sense voltage levels based on a given sequence of bit positions in the input registers to respective ones of the set of word lines; sensing one or more sets of bit lines in response to each sequence of applied sense voltage levels to determine partial products from each set of bit lines for each sequence of applied sense voltage levels; accumulating each determined partial product of each of the one or more set of bit lines; bit shifting the accumulated partial product after accumulating each determined partial product to determine the dot product of the first matrix and the second matrix.

Example 14 includes the method of calculating the dot product according to Example 13, wherein: the given sequence of bit positions comprises a sequence from a most significant bit to a least-significant bit; and the bit shifting comprises left bit shifting.

Example 15 includes the method of calculating the dot product according to Example 13, wherein: the given sequence of bit positions comprises a sequence from a least-significant bit to a most significant bit; and the bit shifting comprises right bit shifting.

Example 16 includes the method of calculating the dot product according to Example 13, wherein sequencing the word line driver based on the bit value in the input register over the sequence of bit positions of the second vector comprises, for each bit position of the input register, sequencing over the plurality of word lines.

Example 17 includes the method of calculating the dot product according to Example 13, wherein sequencing the word line driver based on the bit value in the input register over the sequence of bit positions of the second vector comprises, for each word line, sequencing over the plurality of bit positions of the input register.

Example 18 includes the method of calculating the dot product according to Example 13, further comprising: determining if a current bit value is zero; skipping the applying the sense voltage level if the current bit value is zero; skipping the sensing respective one of the set of bit lines if the current bit value is zero; skipping the accumulating the determined partial product if the current bit value is zero.

Example 19 includes the method of calculating the dot product according to Example 13, further comprising: caching the determined partial products before accumulating each determined partial products.

Example 20 includes the method of calculating the dot product according to Example 13, further comprising: truncating the bit shifted accumulated partial product to n bits.

Example 21 includes the method of calculating the dot product according to Example 13, further comprising: caching the determined dot product.

Example 22 includes the method of calculating the dot product according to Example 21, further comprising: wherein caching the determined dot product includes maxpooling, striding or averaging over a plurality of successive determined dot products.

Example 23 includes a memory device comprising: an array of memory cells arranged in a plurality of rows of memory cells coupled to respective word lines and a plurality of columns of the memory cells coupled to respective bit lines, wherein the memory cells are configured to store a first matrix; address inputs configured to sequentially select a respective word line in the set of word lines; an input register coupled to a read enable, wherein the input register is configured to store one or more bits of one or more elements of a second matrix; word line drivers coupled to the address inputs, the read enable and to corresponding word lines, wherein the word line drivers are configured to sequentially bias a respective set of word lines based on a current bit value in the input register and the current address inputs; readout circuitry coupled to one or more sets of respective bit lines, wherein the readout circuitry is configured to sense the one or more sets of respective bit lines to determine partial products for each set of respective bit lines in response to the word line drivers biasing each word line based on each bit position in the corresponding input register; one or more accumulators coupled to the readout circuitry, wherein each accumulator is associated with a respective set of bit lines, and wherein each accumulator is configured to sum each partial product determined by the corresponding readout circuitry to a content of a corresponding shift register and load the sum into the corresponding shift register; and one or more shift register, wherein each shift register is coupled to a respective accumulator, and wherein each shift register is configured to shift the sum in a given direction after a predetermined number of sums are loaded into the shift register and to output a resulting dot product of the first and second matrix.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory device comprising:
   an array of memory cells arranged in a plurality of rows of memory cells coupled to respective word lines and a plurality of columns of the memory cells coupled to respective bit lines, wherein the memory cells are configured to store a first matrix;
   one or more sets of input registers, wherein each set of input registers are associated with a respective set of word lines, and wherein the input registers in a set are configured to store one or more bits of one or more elements of a second matrix;
   word line drivers coupled to the one or more set of input registers and to corresponding sets of word lines, wherein the word line drivers are configured to sequentially bias a respective set of word lines based on bit values of sequential bit positions in a corresponding set of input registers;
   readout circuitry coupled to one or more sets of respective bit lines, wherein the readout circuitry is configured to bitwise sense the one or more sets of respective bit lines to determine partial products for each set of respective bit lines in response to the word line drivers biasing each word line based on each bit position in the corresponding input register;
   one or more accumulators coupled to the readout circuitry, wherein each accumulator is associated with a respective set of bit lines, and wherein each accumulator is configured to sum each partial product determined by the corresponding readout circuitry to a content of a corresponding shift register and load the sum into the corresponding shift register; and
   one or more shift register, wherein each shift register is coupled to a respective accumulator, and wherein each shift register is configured to shift the sum in a given direction after a predetermined number of sums are loaded into the shift register and to output a resulting dot product of the first and second matrix.

2. The memory device of claim 1, wherein each set of input registers store multiple bits of respective ones of the one or more elements of the second matrix.

3. The memory device of claim 1, wherein each set of input register sequentially store a single bit, sequentially over the bit positions of the one or more elements, of respective ones of the one or more elements of the second matrix.

4. The memory device of claim 1, wherein each set of input registers store multiple bits of a given element, sequentially over the elements of the second matrix.

5. The memory device of claim 1, wherein the word line drivers bias the respective set of word lines sequentially for each given bit position of the respective one or more elements of the second matrix.

6. The memory device of claim 1, wherein the word line drivers bias each given word line based on the sequence of bits of the respective one or more elements of the second matrix.

7. The memory device of claim 1, wherein:
   the sequence of the bit positions proceeds from a most significant bit to a least-significant bit; and
   the sum is left shifted in the shift register.

8. The memory device of claim 1, wherein:
   the sequence of the bit position proceeds from a least-significant bit to a most significant bit; and
   the sum is right shifted in the shift register.

9. The memory device of claim 1, further comprising:
   one or more readout buffers coupled between the readout circuitry and respective ones of the one or more accumulators, wherein each readout buffer is configured to provide a pipelining capability.

10. The memory device of claim 1, further comprising:
one or more secondary registers coupled to the output of a respective shift register, wherein the one or more secondary registers are configured to cache the dot product result for write back to the array of memory cells.

11. The memory device of claim 1, further comprising:
one or more secondary register coupled to the output of a respective shift register, wherein the one or more secondary registers are configured to implement one or more of max-pooling, striding, and averaging over successive dot product results.

12. A memory device comprising:
a plurality of set of array units, wherein each array unit includes:
an array of memory cells arranged in a plurality of rows of memory cells coupled to respective word lines and a plurality of columns of the memory cells coupled to respective bit lines, wherein the memory cells are configured to store a first matrix;
one or more sets of input registers, wherein each set of input registers are associated with a respective set of word lines, and wherein the input registers in a set are configured to store one or more bits of one or more elements of a second matrix;
word line drivers coupled to the one or more set of input registers and to corresponding sets of word lines, wherein the word line drivers are configured to sequentially bias a respective set of word lines based on bit values of sequential bit positions in a corresponding set of input registers;
readout circuitry coupled to respective bit lines, wherein the readout circuitry is configured to bitwise sense the respective bit lines to determine partial products for the respective bit lines in response to the word line drivers biasing each word line based on each bit position in the corresponding input register;
one or more sets of accumulators, wherein each set of accumulators are coupled to the respective readout circuitry of the plurality of sets of array units, wherein each accumulator is associated with a respective set of bit lines, and wherein each accumulator is configured to sum each partial product determined by the corresponding readout circuitry to a content of a corresponding shift register and load the sum into the corresponding shift register; and
one or more sets of shift register, wherein each shift register is coupled to a respective accumulator, and wherein each shift register is configured to shift the sum in a given direction after a predetermined number of sums are loaded into the shift register and to output a resulting dot product of the first and second matrix.

13. A method of calculating a dot product in a memory device comprising:
loading a first matrix into a memory cell array at a set of word lines and bit lines;
loading a second matrix into a plurality of input registers associated with respective one of the set of word lines;
sequentially applying sense voltage levels based on a given sequence of bit positions in the input registers to respective ones of the set of word lines;
bitwise sensing one or more sets of bit lines in response to each sequence of applied sense voltage levels to determine partial products from each set of bit lines for each sequence of applied sense voltage levels;
accumulating each determined partial product of each of the one or more set of bit lines;
bit shifting the accumulated partial product after accumulating each determined partial product to determine the dot product of the first matrix and the second matrix.

14. The method of calculating the dot product according to claim 13, wherein:
the given sequence of bit positions comprises a sequence from a most significant bit to a least-significant bit; and
the bit shifting comprises left bit shifting.

15. The method of calculating the dot product according to claim 13, wherein:
the given sequence of bit positions comprises a sequence from a least-significant bit to a most significant bit; and
the bit shifting comprises right bit shifting.

16. The method of calculating the dot product according to claim 13, wherein sequencing the word line driver based on the bit value in the input register over the sequence of bit positions of the second vector comprises, for each bit position of the input register, sequencing over the plurality of word lines.

17. The method of calculating the dot product according to claim 13, wherein sequencing the word line driver based on the bit value in the input register over the sequence of bit positions of the second vector comprises, for each word line, sequencing over the plurality of bit positions of the input register.

18. The method of calculating the dot product according to claim 13, further comprising:
determining if a current bit value is zero;
skipping the applying the sense voltage level if the current bit value is zero;
skipping the sensing respective one of the set of bit lines if the current bit value is zero;
skipping the accumulating the determined partial product if the current bit value is zero.

19. The method of calculating the dot product according to claim 13, further comprising:
caching the determined partial products before accumulating each determined partial products.

20. The method of calculating the dot product according to claim 13, further comprising:
truncating the bit shifted accumulated partial product to n bits.

21. The method of calculating the dot product according to claim 13, further comprising:
caching the determined dot product.

22. The method of calculating the dot product according to claim 21, further comprising:
wherein caching the determined dot product includes max-pooling, striding or averaging over a plurality of successive determined dot products.

23. A memory device comprising:
an array of memory cells arranged in a plurality of rows of memory cells coupled to respective word lines and a plurality of columns of the memory cells coupled to respective bit lines, wherein the memory cells are configured to store a first matrix;
address inputs configured to sequentially select a respective word line in the set of word lines;
an input register coupled to a read enable, wherein the input register is configured to store one or more bits of one or more elements of a second matrix;
word line drivers coupled to the address inputs, the read enable and to corresponding word lines, wherein the word line drivers are configured to sequentially bias a respective set of word lines based on a current bit value in the input register and the current address inputs;

readout circuitry coupled to one or more sets of respective bit lines, wherein the readout circuitry is configured to bitwise sense the one or more sets of respective bit lines to determine partial products for each set of respective bit lines in response to the word line drivers biasing each word line based on each bit position in the corresponding input register;

one or more accumulators coupled to the readout circuitry, wherein each accumulator is associated with a respective set of bit lines, and wherein each accumulator is configured to sum each partial product determined by the corresponding readout circuitry to a content of a corresponding shift register and load the sum into the corresponding shift register; and one or more shift register, wherein each shift register is coupled to a respective accumulator, and wherein each shift register is configured to shift the sum in a given direction after a predetermined number of sums are loaded into the shift register and to output a resulting dot product of the first and second matrix.

* * * * *